(12) United States Patent
Lu et al.

(10) Patent No.: US 11,502,043 B2
(45) Date of Patent: Nov. 15, 2022

(54) SEMICONDUCTOR STRUCTURE AND METHOD FOR FABRICATING SEMICONDUCTOR STRUCTURE

(71) Applicant: Taiwan Semiconductor Manufacturing Company, Ltd., Hsinchu (TW)

(72) Inventors: Chung-Yu Lu, Hsinchu (TW); Yao-Jen Chang, Hsinchu (TW); Sao-Ling Chiu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 34 days.

(21) Appl. No.: 17/226,366

(22) Filed: Apr. 9, 2021

(65) Prior Publication Data

US 2021/0233863 A1    Jul. 29, 2021

Related U.S. Application Data

(62) Division of application No. 16/548,341, filed on Aug. 22, 2019, now Pat. No. 10,978,404.

(51) Int. Cl.
  *H01L 23/544*  (2006.01)
  *H01L 21/308*  (2006.01)
  *H01L 21/027*  (2006.01)

(52) U.S. Cl.
  CPC ........ *H01L 23/544* (2013.01); *H01L 21/0274* (2013.01); *H01L 21/3083* (2013.01); *H01L 2223/54426* (2013.01)

(58) Field of Classification Search
  CPC ............. H01L 21/0274; H01L 21/3083; H01L 2223/54426
  See application file for complete search history.

(56) References Cited

U.S. PATENT DOCUMENTS 8,187,897 B2   5/2012  Cohn et al.
10,510,676 B2  12/2019 Hu et al.
(Continued)

FOREIGN PATENT DOCUMENTS

TW    201910906 A    3/2019
TW    201926482 A    7/2019

OTHER PUBLICATIONS

Chinese language office action dated Aug. 30, 2021, issued in application No. TW 109124518.

*Primary Examiner* — Peniel M Gumedzoe
(74) *Attorney, Agent, or Firm* — McClure, Qualey & Rodack, LLP

(57) ABSTRACT

Method for fabricating a semiconductor structure is provided. First features are formed in a first product region of each die area and in a material layer through a first mask. Second features are formed in a second product region of each die area and in the material layer through a second mask. Third features are formed in a third product region of each die area and in the material layer through a third mask. Fourth features are formed in a fourth product region of each die area and in the material layer through a fourth mask. Fifth features are formed in an alignment region between the first, second, third and fourth product regions of each die area and in the material layer through the first, second, third and fourth masks. The first product region is free of the second, third, and fourth features.

20 Claims, 16 Drawing Sheets

(56) References Cited

U.S. PATENT DOCUMENTS

| | | |
|---|---|---|
| 10,996,558 B2 | 5/2021 | Yu et al. |
| 2010/0144063 A1* | 6/2010 | Furumiya ............... H01L 24/06 |
| | | 257/E21.531 |
| 2013/0027073 A1 | 1/2013 | Pagani et al. |
| 2017/0213798 A1 | 7/2017 | Wei |
| 2018/0096952 A1 | 4/2018 | Miccoli |
| 2019/0033706 A1 | 1/2019 | Yu |
| 2019/0115302 A1 | 4/2019 | Blank et al. |
| 2019/0155144 A1 | 5/2019 | Zhou et al. |

* cited by examiner

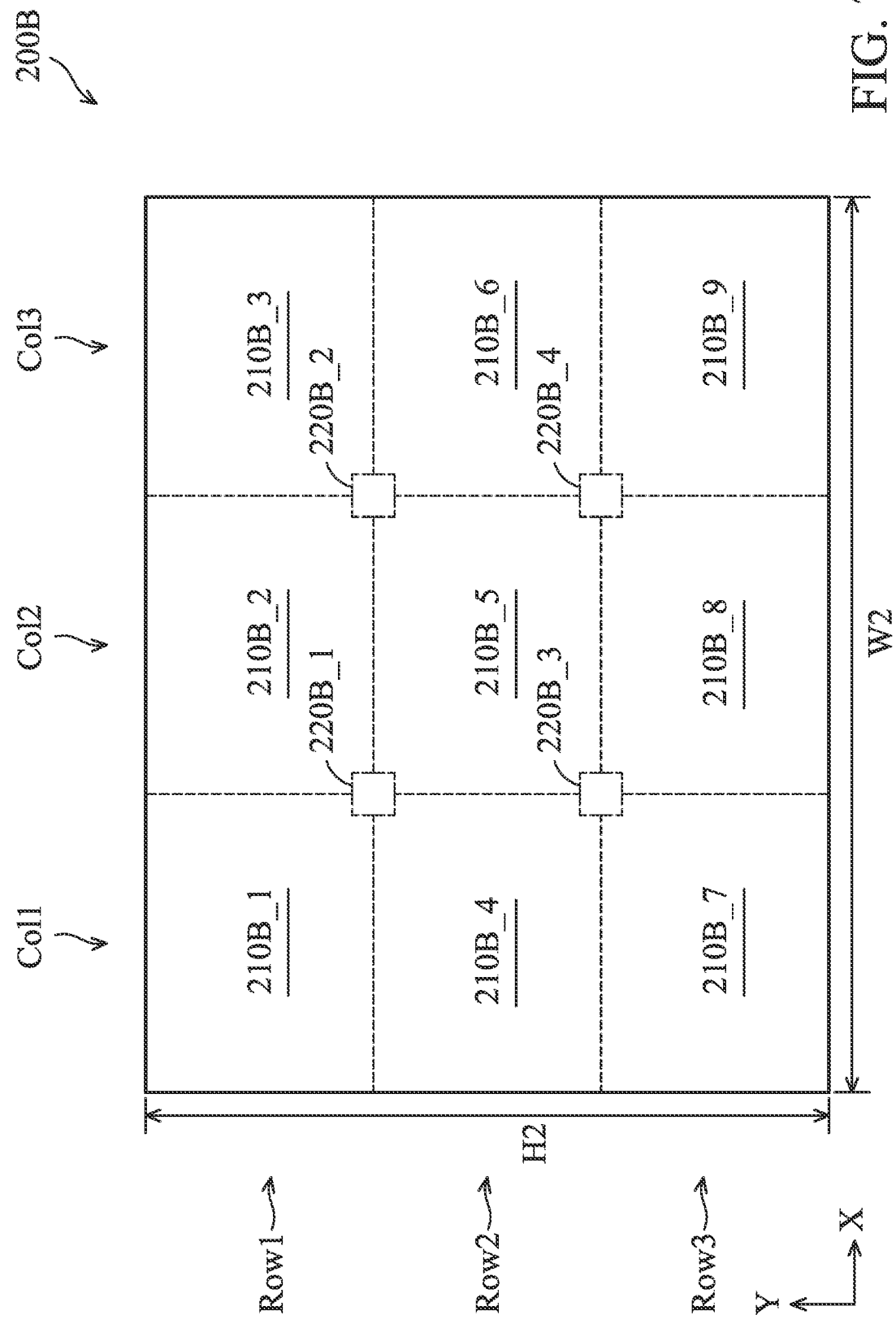

SEMICONDUCTOR STRUCTURE AND METHOD FOR FABRICATING SEMICONDUCTOR STRUCTURE

CROSS REFERENCE TO RELATED APPLICATIONS

This Application is a Divisional of application Ser. No. 16/548,341, filed on Aug. 22, 2019, the entirety of which is incorporated by reference herein.

BACKGROUND

Integrated circuits (ICs) have become increasingly important. Applications using ICs are used by millions of people. Examples of these applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

The semiconductor industry has experienced rapid growth due to continuous improvements in the integration density and the complexity of a variety of electronic components. When the functions and the complexity are increased, the area size of the IC is increased.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

FIG. 7 shows a plan view of a semiconductor structure, in accordance with some embodiments of the disclosure.

DETAILED DESCRIPTION

Figure 1:
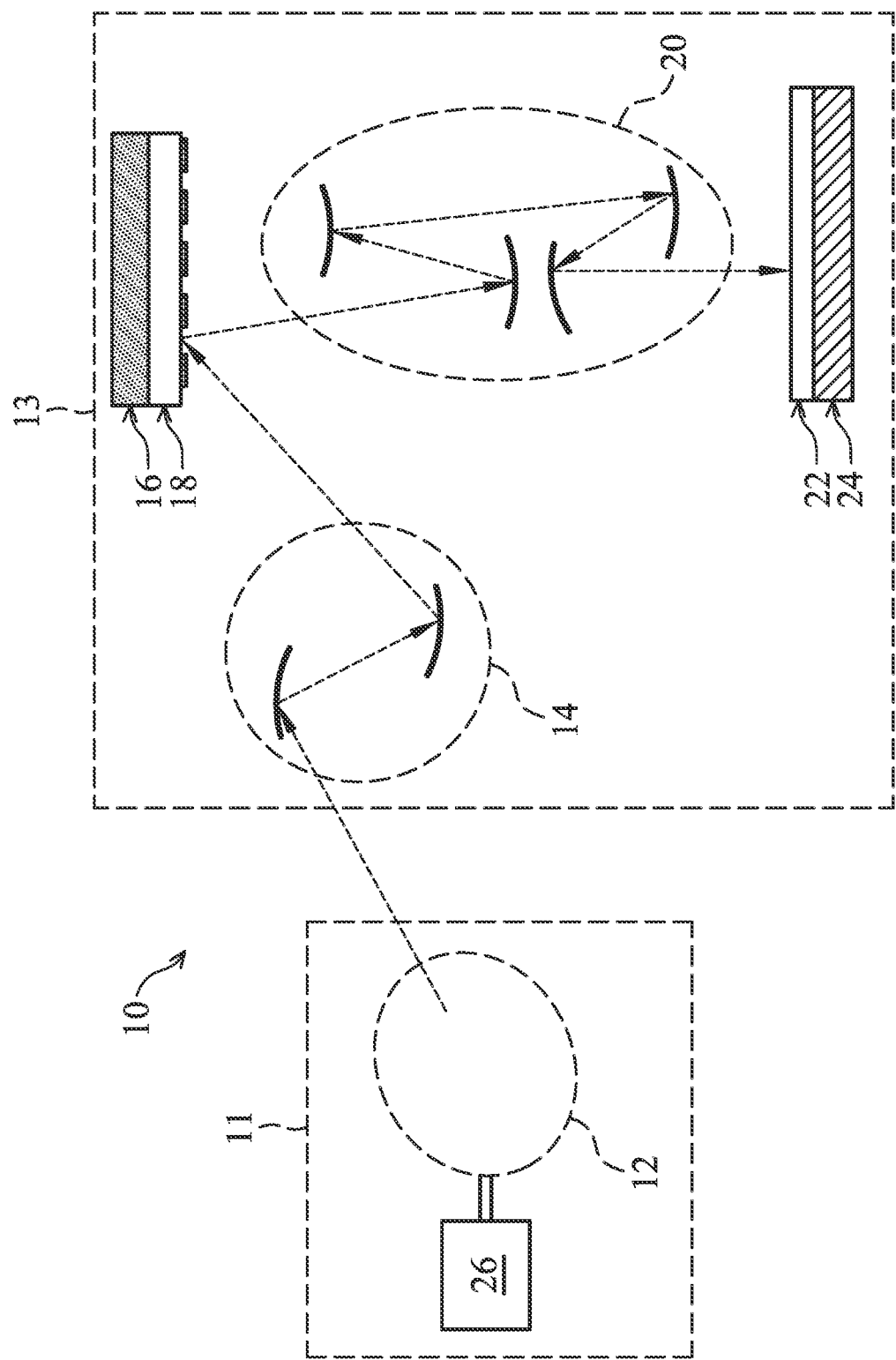
FIG. 1 shows a schematic and diagrammatic view of a lithography system, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

FIG. 1 shows a schematic and diagrammatic view of a lithography system 10, in accordance with some embodiments of the disclosure. The lithography system 10 is operable to perform lithography exposing processes with respective radiation source and exposure mode.

The lithography system 10 includes a light source 12, an illuminator 14, a mask stage 16, a projection optics module (or projection optics box (POB)) 20, a substrate stage 24, and a gas supply module 26. In some embodiments, the light source 12 and the gas supply module 26 are implemented in an extreme ultraviolet (EUV) radiation source apparatus 11. Furthermore, the illuminator 14, the mask stage 16, the projection optics module 20 and the substrate stage 24 are implemented in an EUV scanner 13. The elements of the lithography system 10 can be added to or omitted, and the invention should not be limited by the embodiment.

The light source 12 is configured to generate radiation having a wavelength ranging between about 1 nm and about 100 nm. In some embodiments, the light source 12 is capable of generating an EUV radiation (or light) with a wavelength centered at about 13.5 nm. In such embodiments, the light source 12 is also referred to as an EUV light source. In some embodiments, the light source 12 can be utilized to perform any high-intensity photon emission from excited target material.

The illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the light source 12 onto a mask stage 16, particularly to a mask (or a reticle) 18 secured on the mask stage 16. In such embodiments, the light source 12 generates light in the EUV wavelength range, and reflective optics is employed.

The mask stage 16 is configured to secure the mask 18. In some embodiments, the mask stage 16 includes an electrostatic chuck (e-chuck) to secure the mask 18. This is because the gas molecules absorb EUV light and the lithography system for the EUV lithography patterning is maintained in a vacuum environment to avoid EUV intensity loss. In such embodiments, the terms mask, photomask, and reticle are used interchangeably.

In some embodiments, the mask 18 is a chrome (Cr) mask. In some embodiments, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. In some embodiments, a given exposed area of the mask 18 is limited by the EUV scanner 13.

In some embodiments, the mask 18 includes reflective multilayer deposited on the substrate. The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The mask 18 may further include a capping layer, such as ruthenium (Ru), disposed on the reflective multilayer for protection. The mask 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift mask.

The projection optics module (or POB) 20 is configured to provide a patterned beam and project the patterned beam onto a semiconductor substrate 22, so as to image the pattern of the mask 18 on to the semiconductor substrate 22 secured on a substrate stage 24 of the lithography system 10. In some embodiments, the projection optics module 20 has refractive optics (such as for a UV lithography system) or alternatively reflective optics (such as for an EUV lithography system). The light directed from the mask 18, carrying the image of the pattern defined on the mask, is collected by the projection optics module 20. In some embodiments, the illuminator 14 and the projection optics module 20 are collectively referred to as an optical module of the lithography system 10.

The semiconductor substrate 22 is a semiconductor wafer, and the semiconductor wafer may be made of silicon or other semiconductor materials. Alternatively or additionally, the semiconductor substrate 22 may include other elementary semiconductor materials such as germanium (Ge). In some embodiments, the semiconductor substrate 22 is made of a compound semiconductor such as silicon carbide (SiC), gallium arsenic (GaAs), indium arsenide (InAs), or indium phosphide (InP). In some embodiments, the semiconductor substrate 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor substrate 22 may be a silicon-on-insulator (SOI) or a germanium-on-insulator (GOI) substrate.

The semiconductor substrate 22 may have various devices. Examples of devices that are formed in the semiconductor substrate 22 include active device and passive devices, such as transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor substrate 22 is coated with a resist layer sensitive to the EUV light. Various components including those described above are integrated together and are operable to perform lithography exposing processes.

The lithography system 10 may further include other modules or be integrated with (or be coupled with) other modules. For example, the gas supply module 26 is configured to provide hydrogen gas to the light source 12, so as to decrease contamination of the light source 12.

Figure 2:
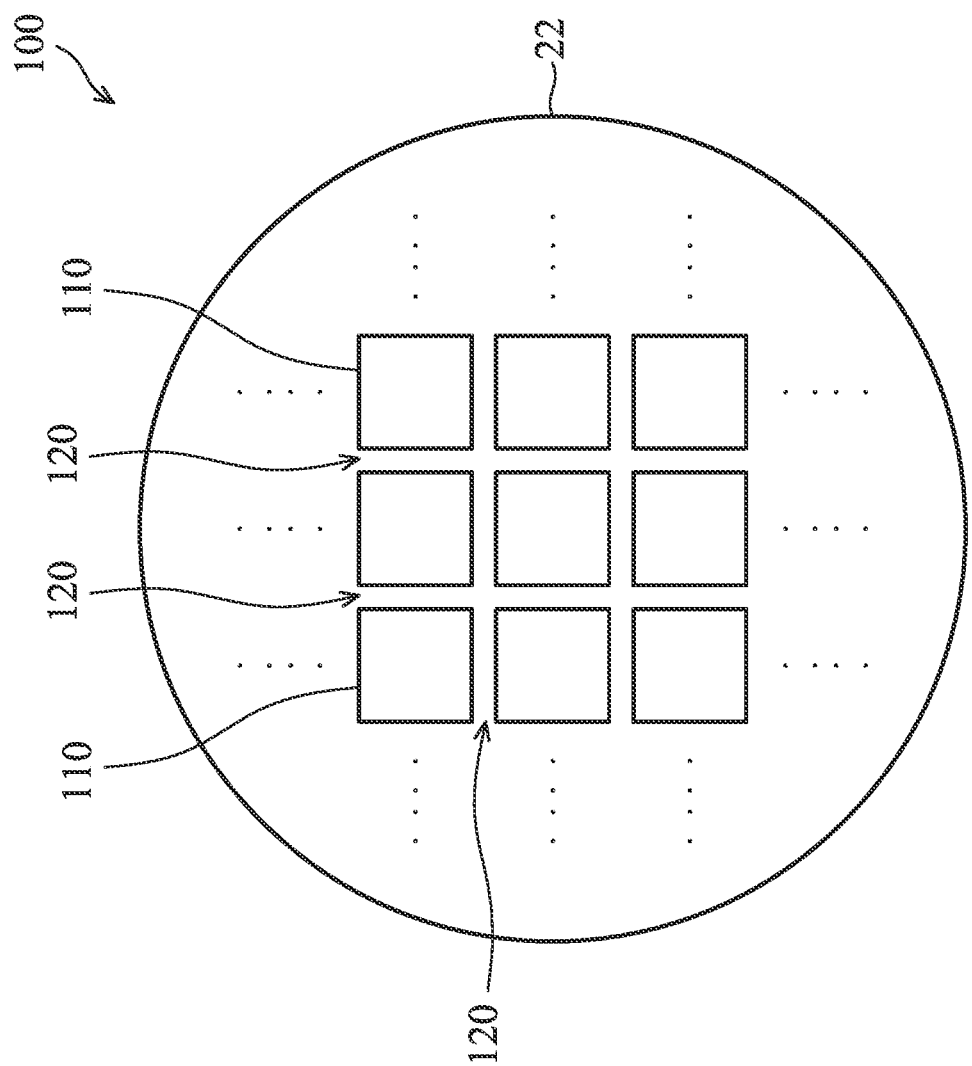
FIG. 2 shows a plan view of a semiconductor wafer, in accordance with some embodiments of the disclosure.

FIG. 2 shows a plan view of a semiconductor wafer 100, in accordance with some embodiments of the disclosure. The semiconductor wafer 100 includes multiple dies 110 over the semiconductor substrate 22, and die areas of the dies 110 are separated from each other by a number of scribe lines 120. The scribe line 120 is formed on the exterior side of the dies 110 and surrounds the dies 110. Furthermore, each die 110 includes a die seal ring (not shown) so that when the semiconductor wafer 100 is provided to assembly, each die is accordingly protected. The die seal rings of the die areas are formed between the dies 110 and the scribe line 120, such that the die seal ring could be used as a blocking wall for protecting the dies 110 from external stress while the semiconductor wafer 100 is diced. The cutting operation is performed by using a cutter to cut the semiconductor wafer 100 into individual dies 110 along the scribe lines 120.

Figure 3:
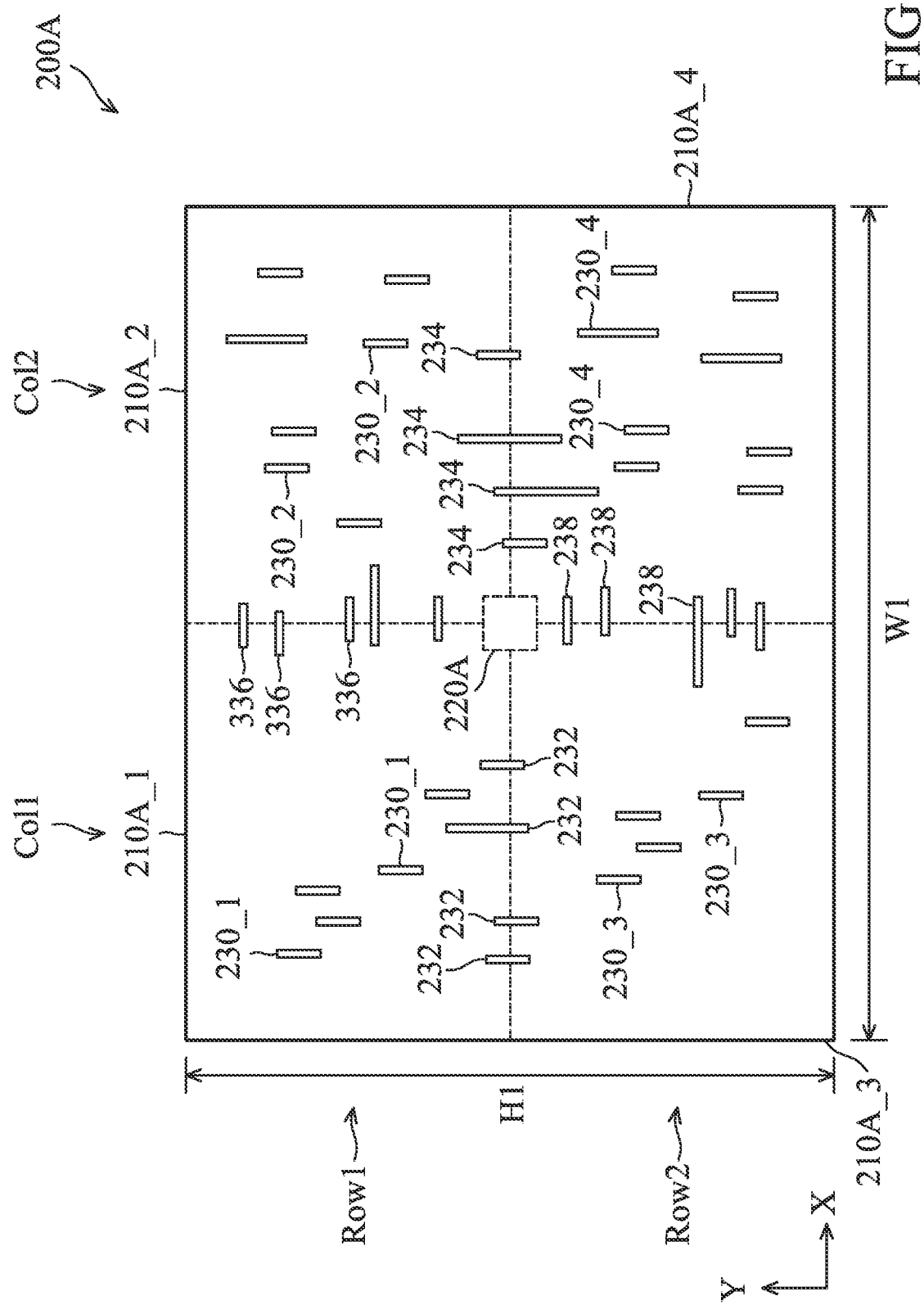
FIG. 3 shows a plan view of a semiconductor structure, in accordance with some embodiments of the disclosure.

FIG. 3 shows a plan view of a semiconductor structure 200A, in accordance with some embodiments of the disclosure. The semiconductor structure 200A is a die (e.g., the die 110 of FIG. 2) of a semiconductor wafer (e.g., the semiconductor wafer 100 of FIG. 2), and active and/or passive devices formed within the die, and insulating and conductive layers formed over the semiconductor substrate (e.g., the semiconductor substrate 22 of FIG. 2).

The semiconductor structure 200A includes four product regions 210A_1 through 210A_4 and an alignment region 220A. The product regions 210A_1 through 210A_4 are arranged in rows Row1 and Row2 and columns Col1 and Col2 of an array. For example, the product regions 210A_1 and 210A_2 are arranged in the first row Row1 of the array, and the product region 210A_1 is adjacent to and in physical contact with the product region 210A_2. Furthermore, the product regions 210A_1 and 210A_3 are arranged in the first column Col1 of the array, and the product region 210A_1 is adjacent to and in physical contact with the product region 210A_3.

For the semiconductor structure 200A of FIG. 3, the side length along the X direction is W1, and the side length along the Y direction is H1. In some embodiments, the side length along the Y direction (e.g., height or length) is less than the side length along the X direction (e.g., width), i.e., H1<W1. In some embodiments, the longest side of the semiconductor structure 200A (e.g., the side length along the X direction) is greater than the longest side of a given exposed area in a mask. For example, the area of a typical mask is 33 mm×26 mm, and the longest side of the semiconductor structure 200A (e.g., the side length along the X direction) is greater than 33 millimeters. Therefore, the semiconductor structure 200A cannot be formed by using a single mask. In other words, the area of the semiconductor structure 200A is greater than that of a single mask, and the semiconductor structure 200A is formed by stitching multiple masks together. Furthermore, the side length of each of the product regions 210A_1 through 210A_4 along the X direction is about half of W1 (e.g., W1/2), and the side length of each of the product regions 210A_1 through 210A_4 along the Y direction is about half of H1 (e.g., H1/2). In some embodiments, the product regions 210A_1 through 210A_4 have the similar shape and the similar size area.

Each of the product regions 210A_1 through 210A_4 may include a plurality of semiconductor devices, such as transistors, resistors, inductors, capacitors, and so on. Furthermore, each of the product regions 210A_1 through 210A_4 is formed by using respective mask in the corresponding lithography processes. The product regions 210A_1 through 210A_4 are arranged in rows and columns of an array, and the alignment region 220A is arranged at the center of the array. The alignment region 220A is disposed between the product regions 210A_1 through 210A_4, and contacts the product regions 210A_1 through 210A_4.

The alignment region 220A is where alignment marks are formed, and the alignment marks will be described below. Furthermore, the alignment region 220A is formed by using the masks corresponding to the product regions 210A_1 through 210A_4 in various lithography processes. The alignment region 220A may have any shape. In FIG. 3, the alignment region 220A has a square shape. In some embodiments, the alignment region 220A has a rectangular shape.

In the semiconductor structure 200A, the number of rows and columns in the array formed by the product regions 210A_1 through 210A_4 is 2, and the number of the alignment regions is equal to $(2-1)^2$, i.e., one alignment region 220A.

Figure 4:
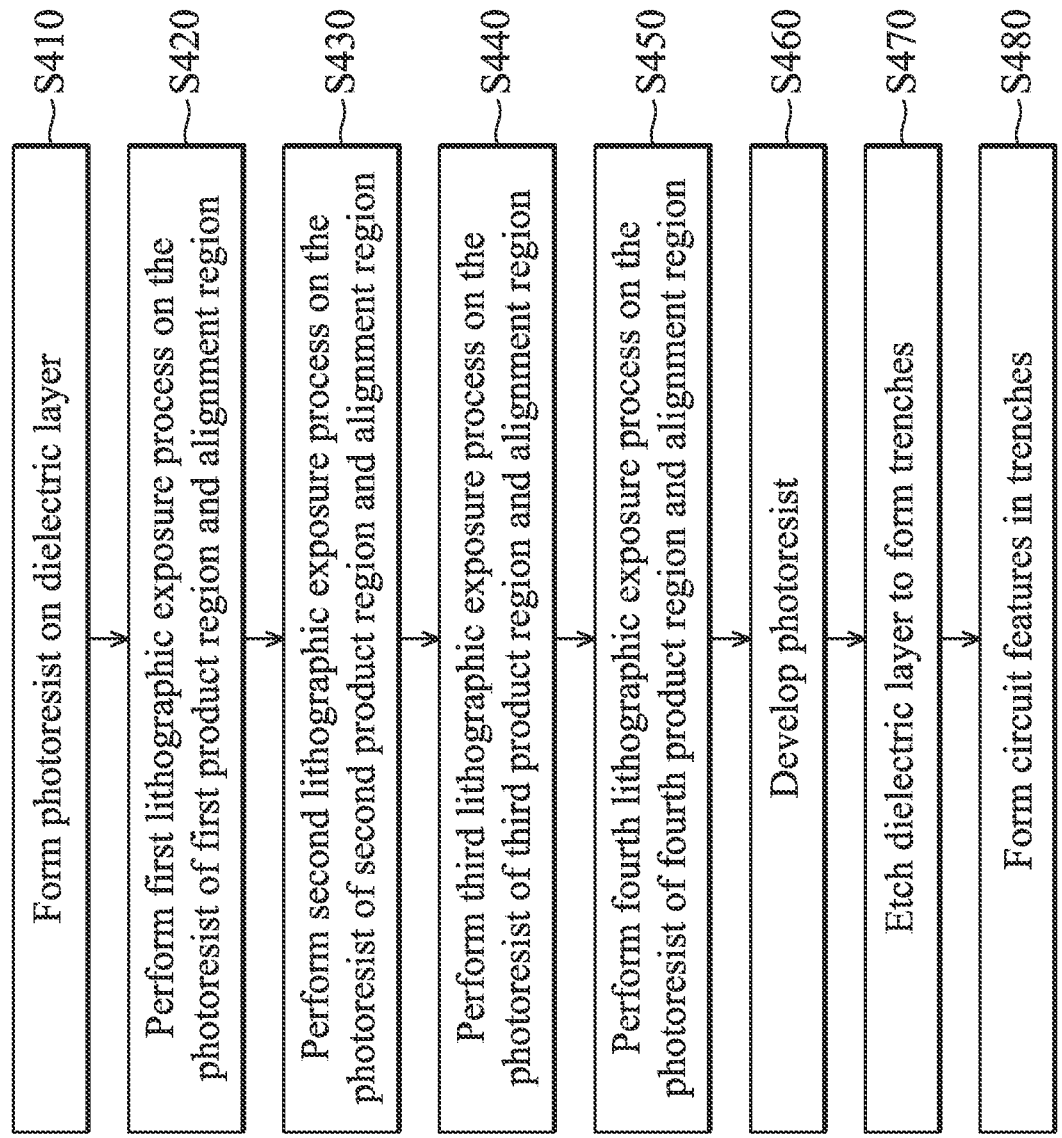
FIG. 4 shows a process flow for fabricating the semiconductor structure of FIG. 3, in accordance with some embodiments of the disclosure.

FIG. 4 shows a process flow for fabricating the semiconductor structure 200A of FIG. 3, in accordance with some embodiments of the disclosure.

In operation S410, a photoresist (not shown) is formed on a dielectric layer (not shown) of the product regions 210A_1 through 210A_4 over a semiconductor substrate (e.g., the semiconductor substrate 22 of FIG. 2).

Figure 5A:
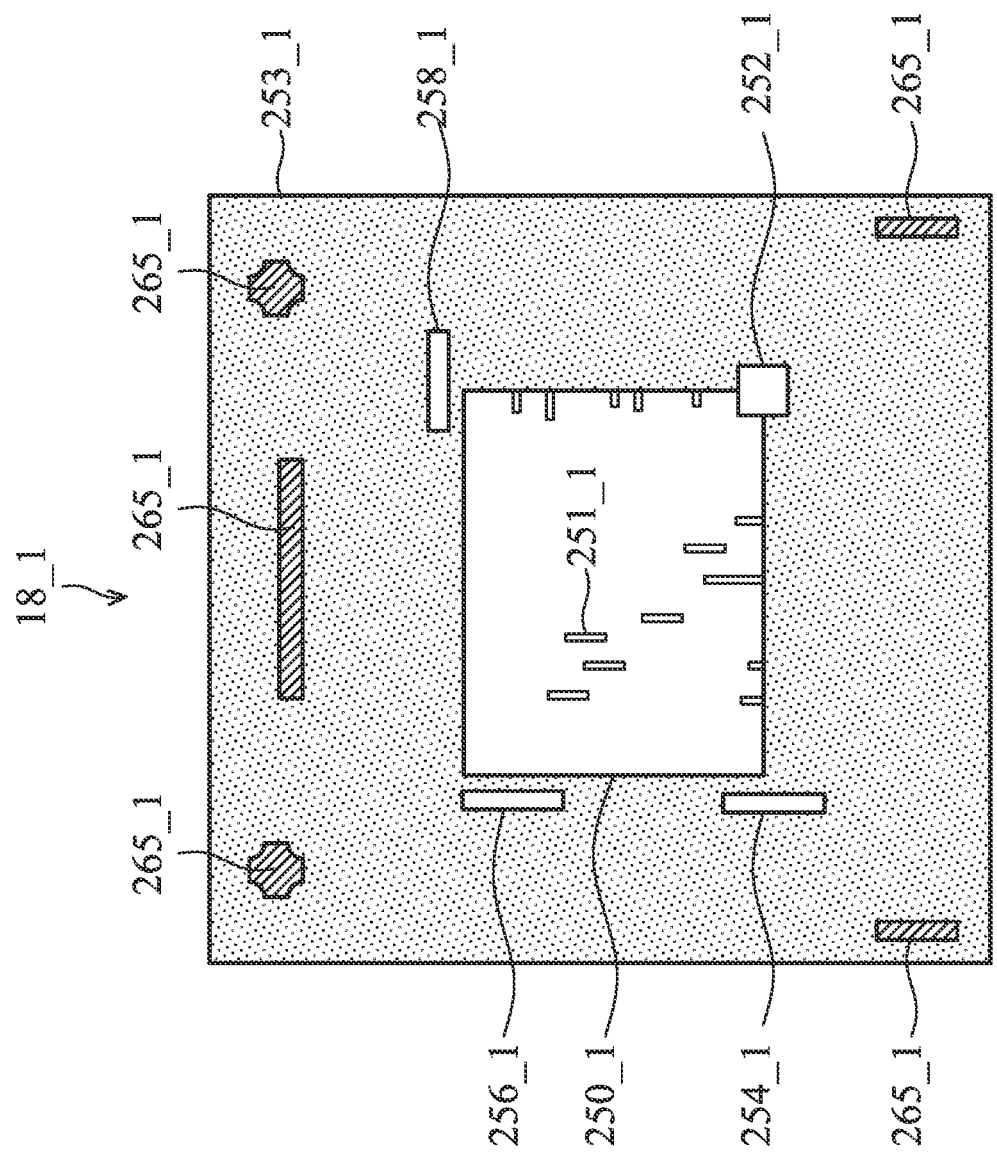
FIGS. 5A-5D show the masks corresponding to the product regions and the alignment region of FIG. 3, in accordance with some embodiments of the disclosure.

In operation S420, a first lithographic exposure process is performed on the photoresist of the product region 210A_1 and the alignment region 220A by a lithography system 10 of FIG. 1 with a mask 18_1 of FIG. 5A. In the first lithographic exposure process, the mask 18_1 of FIG. 5A is used to expose the photoresist of the product region 210A_1 and the alignment region 220A according to the features present in the mask 18_1.

Referring to FIG. 5A, FIG. 5A shows the mask 18_1 corresponding to the product region 210A_1 and the alignment region 220A of FIG. 3, in accordance with some embodiments of the disclosure. The mask 18_1 includes a main field 250_1 corresponding to the product region 210A_1 and a stitching region 252_1 corresponding to the alignment region 220A. The stitching region 252_1 is an in-die overlap box and arranged in the lower right corner of the main field 250_1 and contacts the main field 250_1. The main field 250_1 includes multiple mask features 251_1. The mask features 251_1 correspond to circuit features to be formed in the semiconductor structure 200A, and when forming the circuit features, the area exposed by the main field 250_1 does not overlap with the exposed area of other mask in exposure process.

In the main field 250_1 of the mask 18_1, the mask features 251_1 can be opaque surrounded by a transparent region or transparent surrounded by an opaque region depending on whether they are used to expose positive or negative photoresist. For example, the mask features 251_1 will be transparent if it is used to expose positive photoresist, and the mask features 251_1 will be opaque if it is used to expose negative photoresist.

In the mask 18_1, the stitching region 252_1 includes multiple alignment marks (not shown). The alignment marks correspond to alignment features to be formed for verifying the stitching result of multiple masks. Therefore, when forming the alignment marks, the area exposed by the stitching region 252_1 overlap with the exposed area of other mask in exposure process, as will be shown in more detail below.

In FIG. 5A, the mask 18_1 further includes a periphery field 253_1. In some embodiments, the main field 250_1 and the stitching region 252_1 are surrounded by the periphery field 253_1. Furthermore, the mask 18_1 further includes the mark regions 254_1, 256_1 and 258_1 within the periphery field 253_1. The mark regions 254_1, 256_1 and 258_1 are close to the main field 250_1 and separated from the main field 250_1 by the periphery field 253_1.

Each of the mark regions 254_1, 256_1 and 258_1 includes multiple alignment marks (not shown). The alignment marks correspond to alignment features to be formed in the scribe lines (e.g., the scribe line 120 of FIG. 2). In some embodiments, the mark region 256_1 is arranged close to the upper left corner of the main field 250_1. When forming the alignment marks, the areas exposed by the mark region 256_1 does not overlap with the exposed area of other mask in exposure process. Furthermore, the mark regions 254_1 and 258_1 are arranged close to the lower left corner and the upper right corner of the main field 250_1, respectively. When forming the alignment marks, the areas exposed by the mark regions 254_1 and 258_1 overlap with the exposed area of other mask in exposure process, as will be shown in more detail below.

In FIG. 5A, the mask 18_1 further includes the mark regions 265_1 within the periphery field 253_1. Each mark region 265_1 includes multiple alignment marks (not shown), and the mark regions 265_1 are arranged away from the main field 250_1. In some embodiments, the mark regions 265_1 may include inter-level alignment marks for the mask 18_1, and/or other fiducial features (markings that are not part of an integrated circuit but are nonetheless a part of the mask such as logos and text).

The alignment marks of the mark regions 265_1 and the mark regions 254_1, 256_1 and 258_1 can be opaque surrounded by a transparent region or transparent surrounded by an opaque region depending on whether they are used to expose positive or negative photoresist. For example, the alignment marks will be transparent if it is used to expose positive photoresist, and the alignment marks will be opaque if it is used to expose negative photoresist.

Figure 5B:
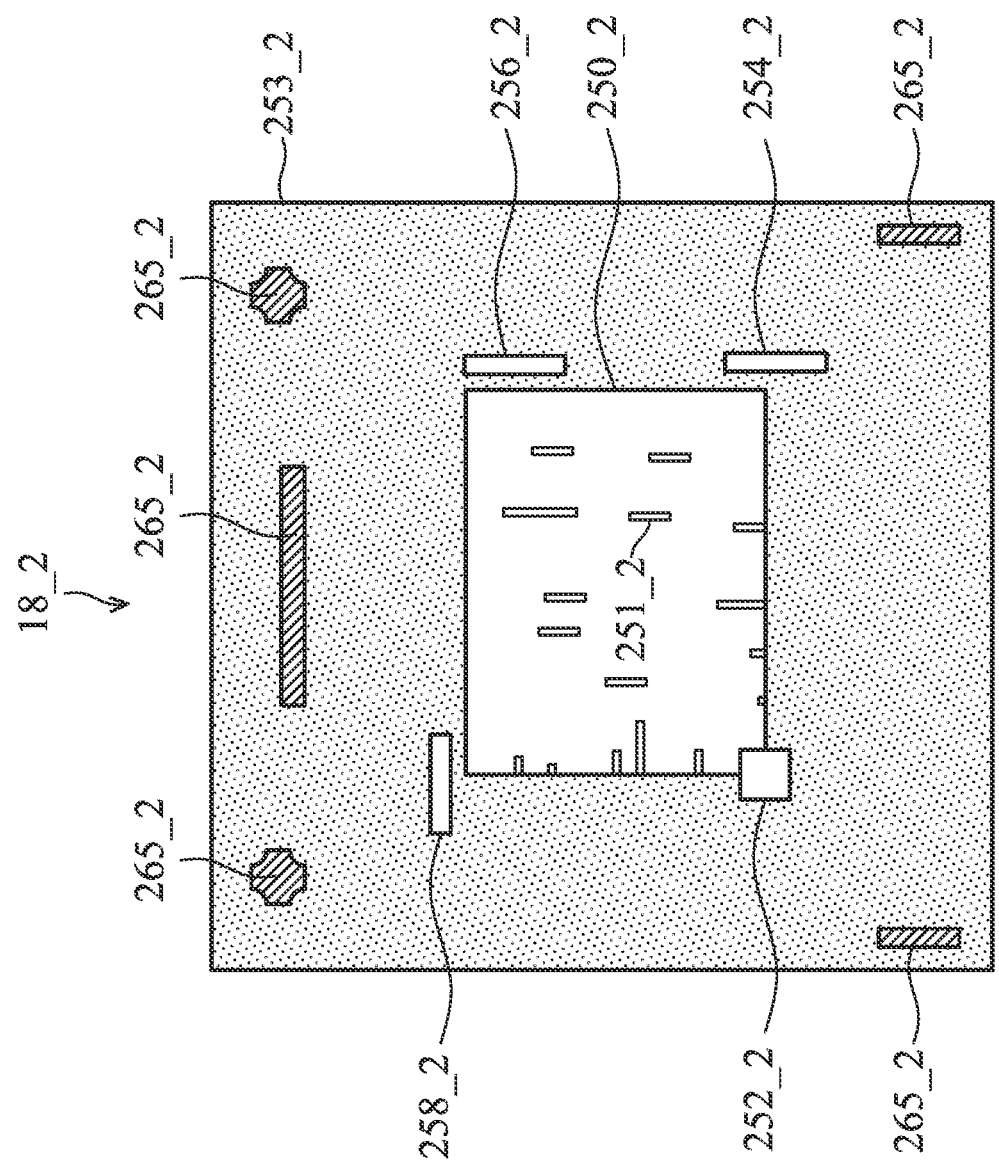

Referring back to the process flow of FIG. 4, in operation S430, a second lithographic exposure process is performed on the photoresist of the product region 210A_2 and the alignment region 220A by the lithography system 10 of FIG. 1 with a mask 18_2 of FIG. 5B. In the second lithographic exposure process, the mask 18_2 of FIG. 5B is used to expose the photoresist of the product region 210A_2 and the alignment region 220A according to the features present in the mask 18_2.

Referring to FIG. 5B, FIG. 5B shows the mask 18_2 corresponding to the product region 210A_2 and the alignment region 220A of FIG. 3, in accordance with some embodiments of the disclosure. The mask 18_2 includes a main field 250_2 and a stitching region 252_2. The stitching region 252_2 is an in-die overlap box and arranged in the lower left corner of the main field 250_2 and contacts the main field 250_2. The main field 250_2 includes multiple mask features 251_2. The mask features 251_2 correspond to circuit features to be formed in the semiconductor structure 200A, and when forming the circuit features, the area exposed by the main field 250_2 does not overlap with the exposed area of other mask in exposure process. For example, the area exposed by the main field 250_2 does not overlap with the area exposed by the main field 250_1 of the mask 18_1 in FIG. 5A.

As described above, the mask features 251_2 of the main field 250_2 can be opaque surrounded by a transparent region or transparent surrounded by an opaque region depending on whether they are used to expose positive or negative photoresist.

In the mask 18_2, the stitching region 252_2 includes multiple alignment marks (not shown). The alignment marks correspond to alignment features to be formed for verifying the stitching result of multiple masks. Therefore, when forming the alignment marks, the area exposed by the stitching region 252_2 in the second lithographic exposure process (operation S430 of FIG. 4) overlaps with the area exposed by the stitching region 252_1 in the first lithographic exposure process (operation S420 of FIG. 4).

In FIG. 5B, the mask 18_2 further includes a periphery field 253_2. In some embodiments, the main field 250_2 and the stitching region 252_2 are surrounded by the periphery field 253_2. Furthermore, the mask 18_2 further includes the mark regions 254_2, 256_2 and 258_2 within the periphery field 253_2. The mark regions 254_2, 256_2 and 258_2 are close to the main field 250_2 and separated from the main field 250_2 by the periphery field 253_2.

Each of the mark regions 254_2, 256_2 and 258_2 includes multiple alignment marks (not shown). The alignment marks correspond to alignment features to be formed in the scribe lines (e.g., the scribe line 120 of FIG. 2). In some embodiments, the mark region 256_2 is arranged close to the upper right corner of the main field 250_2. When forming the alignment marks, the areas exposed by the mark region 256_2 does not overlap with the exposed area of other mask in exposure process. Furthermore, the mark regions 254_2 and 258_2 are arranged close to the lower right corner and the upper left corner of the main field 250_2, respectively. When forming the alignment marks, the areas exposed by the mark regions 254_2 and 258_2 overlap with the exposed area of other mask in exposure process. For example, the area exposed by the mark region 258_2 in the second lithographic exposure process (operation S430 of FIG. 4) overlaps with the area exposed by the mark region 258_1 of FIG. 5A in the first lithographic exposure process (operation S420 of FIG. 4).

In FIG. 5B, the mask 18_2 further includes the mark regions 265_2 within the periphery field 253_2. Each mark region 265_2 includes multiple alignment marks (not shown), and the mark regions 265_2 are arranged away from the main field 250_2. As described above, the mark regions 265_2 may include inter-level alignment marks, and/or other fiducial features.

In FIG. 5B, the alignment marks of the mark regions 265_2 and the mark regions 254_2, 256_2 and 258_2 can be opaque surrounded by a transparent region or transparent surrounded by an opaque region depending on whether they are used to expose positive or negative photoresist.

Figure 5C:
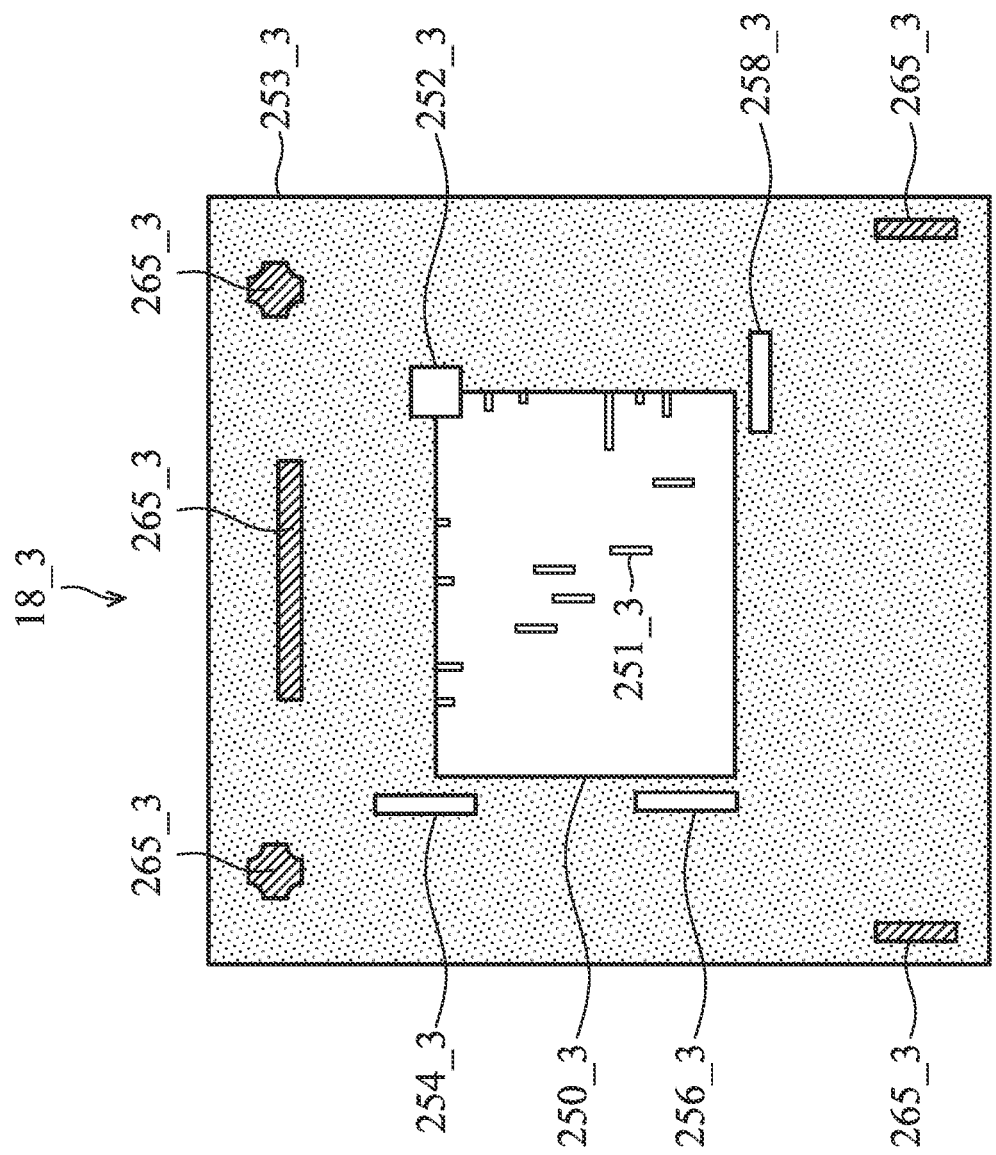

Referring back to the process flow of FIG. 4, in operation S440, a third lithographic exposure process is performed on the photoresist of the product region 210A_3 and the alignment region 220A by the lithography system 10 of FIG. 1 with a mask 18_3 of FIG. 5C. In the third lithographic exposure process, the mask 18_3 of FIG. 5C is used to expose the photoresist of the product region 210A_3 and the alignment region 220A according to the features present in the mask 18_3.

Referring to FIG. 5C, FIG. 5C shows the mask 18_3 corresponding to the product region 210A_3 and the alignment region 220A of FIG. 3, in accordance with some embodiments of the disclosure. The mask 18_3 includes a main field 250_3 and a stitching region 252_3. The stitching region 252_3 is an in-die overlap box and arranged in the upper right corner of the main field 250_3 and contacts the main field 250_3. The main field 250_3 includes multiple mask features 251_3. The mask features 251_3 correspond to circuit features to be formed in the semiconductor structure 200A, and when forming the circuit features, the area exposed by the main field 250_3 does not overlap with the exposed area of other mask in exposure process. For example, the area exposed by the main field 250_3 does not overlap with the area exposed by the main field 250_1 of the mask 18_1 in FIG. 5A, or the main field 250_2 of the mask 18_2 in FIG. 5B.

As described above, the mask features 251_3 of the main field 250_3 can be opaque surrounded by a transparent region or transparent surrounded by an opaque region depending on whether they are used to expose positive or negative photoresist.

In the mask 18_3, the stitching region 252_3 includes multiple alignment marks (not shown). The alignment marks correspond to alignment features to be formed for verifying the stitching result of multiple masks. Therefore, when forming the alignment marks, the area exposed by the stitching region 252_3 in the third lithographic exposure process (operation S440 of FIG. 4) overlaps with the area exposed by the stitching region 252_1 in the first lithographic exposure process (operation S420 of FIG. 4) and the stitching region 252_2 in the second lithographic exposure process (operation S430 of FIG. 4).

In FIG. 5C, the mask 18_3 further includes a periphery field 253_3. In some embodiments, the main field 250_3 and the stitching region 252_3 are surrounded by the periphery field 253_3. Furthermore, the mask 18_3 further includes the mark regions 254_3, 256_3 and 258_3 within the periphery field 253_3. The mark regions 254_3, 256_3 and 258_3 are close to the main field 250_3 and separated from the main field 250_3 by the periphery field 253_3.

Each of the mark regions 254_3, 256_3 and 258_3 includes multiple alignment marks (not shown). The alignment marks correspond to alignment features to be formed in the scribe lines (e.g., the scribe line 120 of FIG. 2). In some embodiments, the mark region 256_3 is arranged close to the lower left corner of the main field 250_3. When forming the alignment marks, the areas exposed by the mark region 256_3 does not overlap with the exposed area of other mask in exposure process. Furthermore, the mark regions 254_3 and 258_3 are arranged close to the upper left corner and the lower right corner of the main field 250_3, respectively. When forming the alignment marks, the areas exposed by the mark regions 254_3 and 258_3 overlap with the exposed area of other mask in exposure process. For example, the area exposed by the mark region 254_3 in the third lithographic exposure process (operation S440 of FIG. 4) overlaps with the area exposed by the mark region 254_1 of FIG. 5A in the first lithographic exposure process (operation S420 of FIG. 4).

In FIG. 5C, the mask 18_3 further includes the mark regions 265_3 within the periphery field 253_3. Each mark region 265_3 includes multiple alignment marks (not shown), and the mark regions 265_3 are arranged away from the main field 250_3. As described above, the mark regions 265_3 may include inter-level alignment marks, and/or other fiducial features.

In FIG. 5C, the alignment marks of the mark regions 265_3 and the mark regions 254_3, 256_3 and 258_3 can be opaque surrounded by a transparent region or transparent surrounded by an opaque region depending on whether they are used to expose positive or negative photoresist.

Figure 5D:
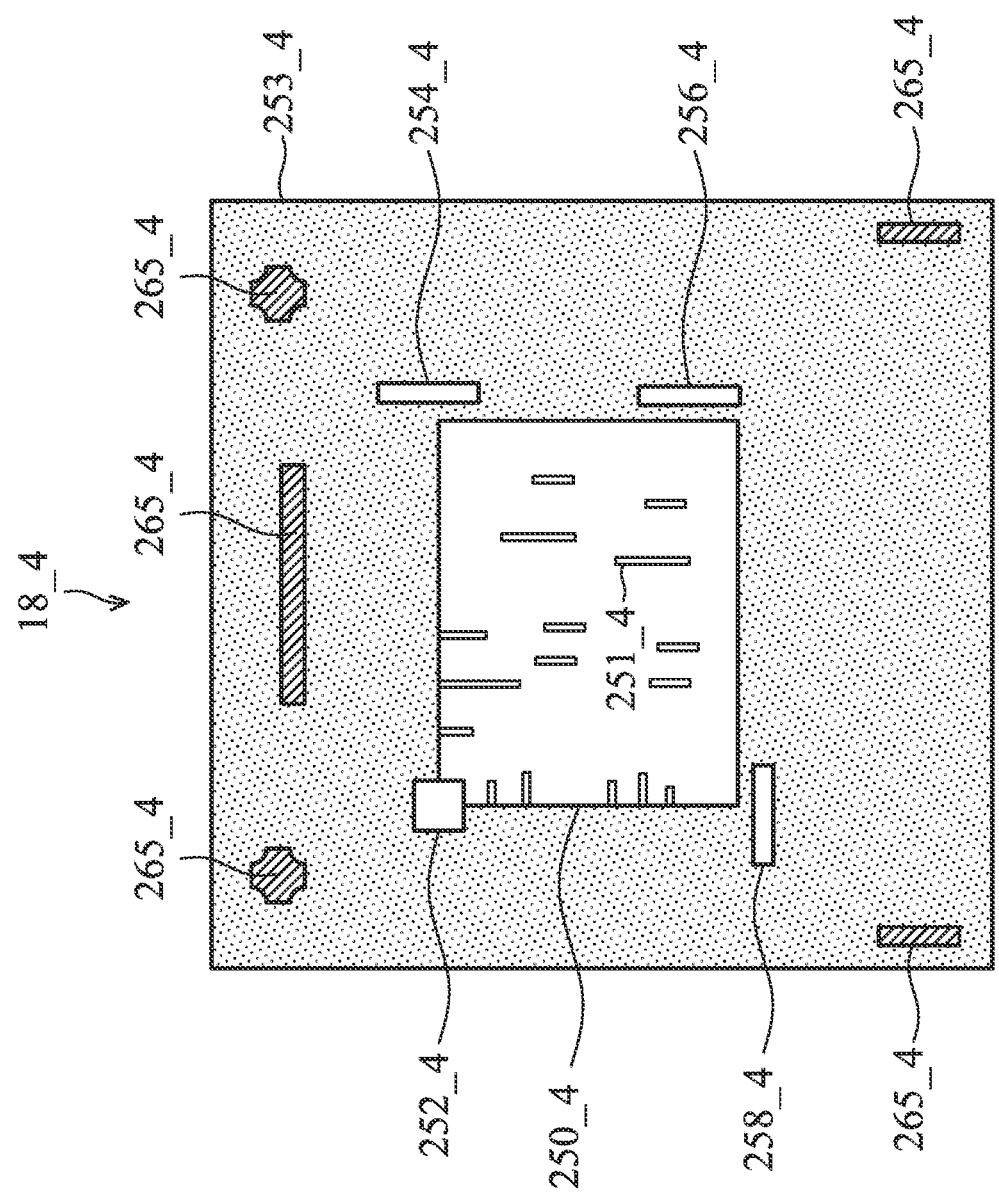

Referring back to the process flow of FIG. 4, in operation S450, a fourth lithographic exposure process is performed on the photoresist of the product region 210A_4 and the alignment region 220A by the lithography system 10 of FIG. 1 with a mask 18_4 of FIG. 5D. In the fourth lithographic exposure process, the mask 18_4 of FIG. 5D is used to expose the photoresist of the product region 210A_4 and the alignment region 220A according to the features present in the mask 18_4.

Referring to FIG. 5D, FIG. 5D shows the mask 18_4 corresponding to the product region 210A_4 and the alignment region 220A of FIG. 3, in accordance with some embodiments of the disclosure. The mask 18_4 includes a main field 250_4 and a stitching region 252_4. The stitching region 252_4 is an in-die overlap box and arranged in the upper left corner of the main field 250_4 and contacts the main field 250_4. The main field 250_4 includes multiple mask features 251_4. The mask features 251_4 correspond to circuit features to be formed in the semiconductor structure 200A, and when forming the circuit features, the area exposed by the main field 250_4 does not overlap with the exposed area of other mask in exposure process. For example, the area exposed by the main field 250_4 does not overlap with the area exposed by the main field 250_1 of the mask 18_1 in FIG. 5A, the main field 250_2 of the mask 18_2 in FIG. 5B, or the main field 250_3 of the mask 18_3 in FIG. 5C.

As described above, the mask features 251_4 of the main field 250_4 can be opaque surrounded by a transparent region or transparent surrounded by an opaque region depending on whether they are used to expose positive or negative photoresist.

In the mask 18_4, the stitching region 252_4 includes multiple alignment marks (not shown). The alignment marks correspond to alignment features to be formed for verifying the stitching result of multiple masks. Therefore, when forming the alignment marks, the area exposed by the stitching region 252_4 in the fourth lithographic exposure process (operation S450 of FIG. 4) overlaps with the area exposed by the stitching region 252_1 in the first lithographic exposure process (operation S420 of FIG. 4), the stitching region 252_2 in the second lithographic exposure process (operation S430 of FIG. 4), and the stitching region 252_3 in the third lithographic exposure process (operation S440 of FIG. 4).

In FIG. 5D, the mask 18_4 further includes a periphery field 253_4. In some embodiments, the main field 250_4 and the stitching region 252_4 are surrounded by the periphery field 253_4. Furthermore, the mask 18_4 further includes the mark regions 254_4, 256_4 and 258_4 within the periphery field 253_4. The mark regions 254_4, 256_4 and 258_4 are close to the main field 250_4 and separated from the main field 250_4 by the periphery field 253_4.

Each of the mark regions 254_4, 256_4 and 258_4 includes multiple alignment marks (not shown). The alignment marks correspond to alignment features to be formed in the scribe lines (e.g., the scribe line 120 of FIG. 2). In some embodiments, the mark region 256_4 is arranged close to the lower right corner of the main field 250_4. When forming the alignment marks, the areas exposed by the mark region 256_4 does not overlap with the exposed area of other mask in exposure process. Furthermore, the mark regions 254_4 and 258_4 are arranged close to the upper right corner and the lower left corner of the main field 250_4, respectively. When forming the alignment marks, the areas exposed by the mark regions 254_4 and 258_4 overlap with the exposed area of other mask in exposure process. For example, the area exposed by the mark region 254_4 in the fourth lithographic exposure process (operation S450 of FIG. 4) overlaps with the area exposed by the mark region 254_2 of FIG. 5B in the second lithographic exposure process (operation S430 of FIG. 4). Furthermore, the area exposed by the mark region 258_4 in the fourth lithographic exposure process (operation S450 of FIG. 4) overlaps with the area exposed by the mark region 258_3 of FIG. 5C in the third lithographic exposure process (operation S440 of FIG. 4).

In FIG. 5D, the mask 18_4 further includes the mark regions 265_4 within the periphery field 253_4. Each mark region 265_4 includes multiple alignment marks (not shown), and the mark regions 265_4 are arranged away from the main field 250_4. As described above, the mark regions 265_4 may include inter-level alignment marks, and/or other fiducial features.

In FIG. 5D, the alignment marks of the mark regions 265_4 and the mark regions 254_4, 256_4 and 258_4 can be opaque surrounded by a transparent region or transparent surrounded by an opaque region depending on whether they are used to expose positive or negative photoresist.

Referring back to the process flow of FIG. 4, in operation S460, a photoresist developing process is performed on the semiconductor structure 200A. The developing process may leave (or remove) only those portions of the photoresist that were exposed or may leave only those portions of the photoresist that were not exposed.

In operation S470, the remained portions of the photoresist form a pattern, and the pattern is used as an etching mask to etch the underlying dielectric layer, resulting in trenches (not shown) in the dielectric layer. In some embodiments, there is an etch stop layer under the dielectric layer, and the trenches are formed over the etch stop layer. Next, the photoresist is removed.

In operation S480, a plurality of circuit features are formed in the trenches by filling the trenches with a conductive material, such as a metal material. Thus, multiple metal lines or vias of the semiconductor structure 200A are formed.

Referring back to FIG. 3, in some embodiments, the circuit features 230_1 extending along the Y direction within the product region 210A_1 are metal lines, and the metal lines are formed through the mask 18_1 of FIG. 5A. Furthermore, the circuit features 230_3 extending along the Y direction with the product region 210A_3 are also metal lines, and the metal lines are formed through the mask 18_3 of FIG. 5C. Moreover, the circuit features 232 extending along the Y direction and across the product regions 210A_1 and 210A_3 are also metal lines, and the metal lines are formed through the mask 18_1 of FIG. 5A and the mask 18_3 of FIG. 5C.

In FIG. 3, the circuit features 230_2 extending along the Y direction within the product region 210A_2 are metal lines, and the metal lines are formed through the mask 18_2 of FIG. 5B. Furthermore, the circuit features 230_4 extending along the Y direction with the product region 210A_4 are also metal lines, and the metal lines are formed through the mask 18_4 of FIG. 5D. Moreover, the circuit features 234 extending along the Y direction and across the product regions 210A_2 and 210A_4 are also metal lines, and the metal lines are formed through the mask 18_2 of FIG. 5B and the mask 18_4 of FIG. 5D.

In some embodiments, the circuit features 336 extending along the X direction and across the product regions 210A_1 and 210A_2 are also metal lines, and the metal lines are formed through the mask 18_1 of FIG. 5A and the mask 18_2 of FIG. 5B. Furthermore, the circuit features 238 extending along the X direction and across the product regions 210A_3 and 210A_4 are also metal lines, and the metal lines are formed through the mask 18_3 of FIG. 5C and the mask 18_4 of FIG. 5D.

In some embodiments, the width of the circuit features 230_1 within the product region 210A_1, the circuit features 230_2 within the product region 210A_2, the circuit features 230_3 within the product region 210A_3, the circuit features 230_4 within the product region 210A_4 are the same. Furthermore, the width of the circuit features 232 across the product regions 210A_1 and 210A_3, the circuit features 234 across the product regions 210A_2 and 210A_4, the circuit features 336 across the product regions 210A_1 and 210A_2, the circuit features 238 across the product regions 210A_3 and 210A_4 are the same. In some embodiments, the width of the circuit features 230_1, 230_2, 230_3 and 230_4 are equal to the width of the circuit features 232, 234, 336 and 238.

Figure 6:
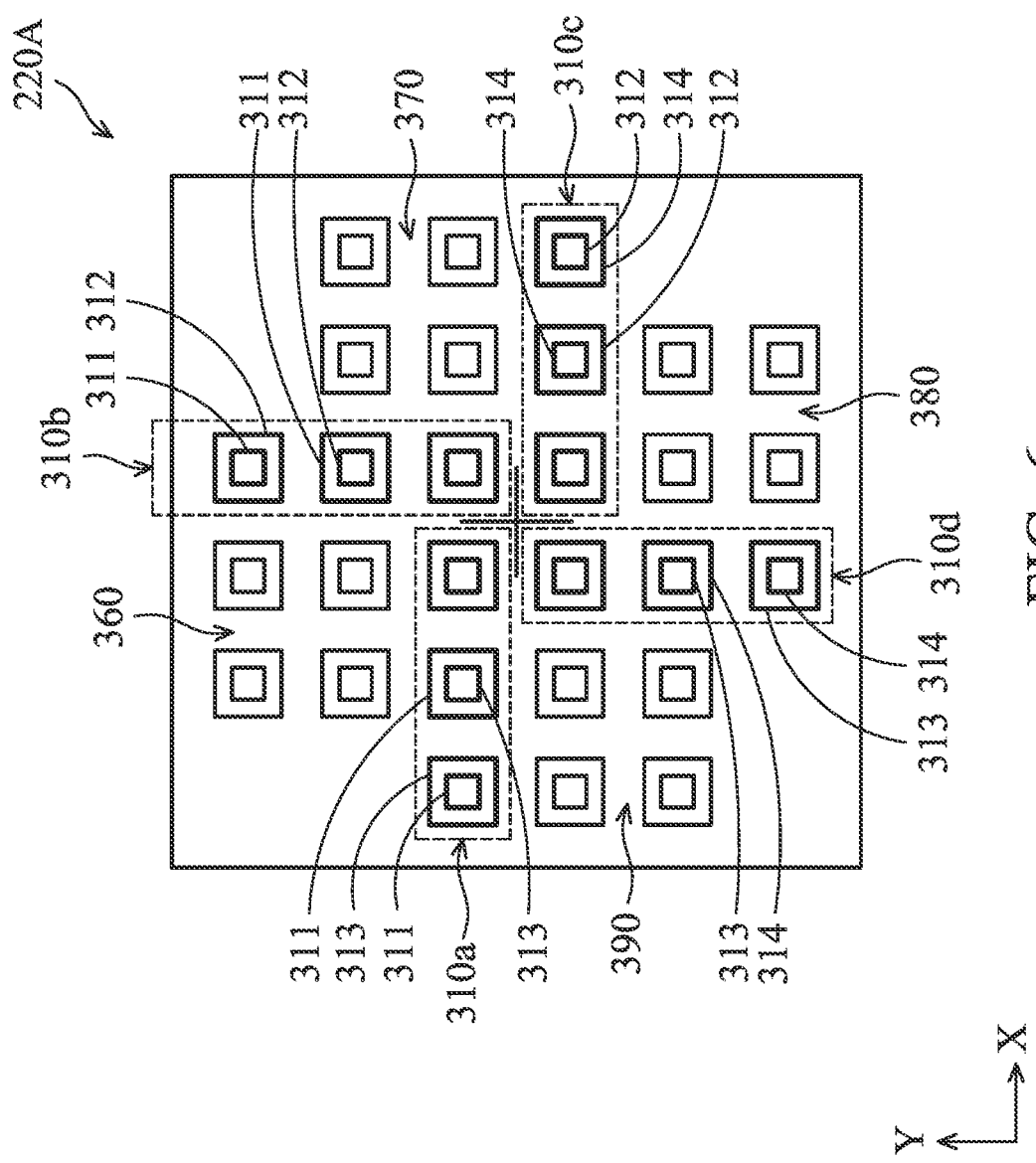
FIG. 6 shows a plan view of the alignment region of FIG. 3, in accordance with some embodiments of the disclosure.

FIG. 6 shows a plan view of the alignment region 220A of FIG. 3, in accordance with some embodiments of the disclosure. In FIG. 6, the alignment region 220A has a square shape. The features within the alignment region 220A are used as the alignment marks. As described above, the alignment marks of the alignment region 220A are formed by using the stitching regions 252_1 through 252_4 of the masks 18_1 through 18_4. Furthermore, no circuit feature (e.g., the circuit features 230_1 through 230_4, 232, 234, 336 or 238 of FIG. 3) is formed in the alignment region 220A.

The alignment region 220A includes the stitching metrology zones 310a through 310d and the overlap metrology zones 360, 370, 380 and 390. The alignment marks of the stitching metrology zones 310a through 310d are used to perform in-chip overlay measurement that compares alignment marks formed by different masks in the same layer of the semiconductor structure 200A. The alignment marks of the stitching metrology zones 310a through 310d form an in-die alignment pattern, and may include box-in-box patterns, cross-in-cross patterns, parallel or abutting test lines, and/or any other suitable type of alignment mark. Furthermore, the alignment marks of the stitching metrology zones 310a through 310d may be similar or different.

In FIG. 6, the stitching metrology zone 310a is close to the boundary between the product regions 210A_1 and 210A_3 of FIG. 3. The alignment marks of the stitching metrology zone 310a are used to perform the in-chip overlay measurement between the mask 18_1 of FIG. 5A and the mask 18_3 of FIG. 5C. For example, in the stitching metrology zone 310a, the alignment marks 311 are formed through the mask 18_1 of FIG. 5A, and the alignment marks 313 are formed through the mask 18_3 of FIG. 5C. Therefore, the distances along the X direction and the distances along the Y direction between the alignment marks 311 and 313 are obtained in the in-chip overlay measurement, so as to determine whether the overlay-shift is present between the first lithographic exposure process corresponding to the mask 18_1 and the third lithographic exposure process corresponding to the mask 18_3.

The stitching metrology zone 310b of FIG. 6 is close to the boundary between the product regions 210A_1 and 210A_2 of FIG. 3. The alignment marks of the stitching metrology zone 310b are used to perform the in-chip overlay measurement between the mask 18_1 of FIG. 5A and the mask 18_2 of FIG. 5B. For example, in the stitching metrology zone 310b, the alignment marks 311 are formed through the mask 18_1 of FIG. 5A, and the alignment marks 312 are formed through the mask 18_2 of FIG. 5B. Therefore, the distances along the X direction and the distances along the Y direction between the alignment marks 311 and 312 are obtained in the in-chip overlay measurement, so as to determine whether the overlay-shift is present between the first lithographic exposure process corresponding to the mask 18_1 and the second lithographic exposure process corresponding to the mask 18_2.

The stitching metrology zone 310c of FIG. 6 is close to the boundary between the product regions 210A_2 and 210A_4 of FIG. 3. The alignment marks of the stitching metrology zone 310c are used to perform the in-chip overlay measurement between the mask 18_2 of FIG. 5B and the mask 18_4 of FIG. 5D. For example, in the stitching metrology zone 310c, the alignment marks 312 are formed through the mask 18_2 of FIG. 5B, and the alignment marks 314 are formed through the mask 18_4 of FIG. 5D. Therefore, the distances along the X direction and the distances along the Y direction between the alignment marks 312 and 314 are obtained in the in-chip overlay measurement, so as to determine whether the overlay-shift is present between the second lithographic exposure process corresponding to the mask 18_2 and the fourth lithographic exposure process corresponding to the mask 18_4.

The stitching metrology zone 310d of FIG. 6 is close to the boundary between the product regions 210A_3 and 210A_4 of FIG. 3. The alignment marks of the stitching metrology zone 310d are used to perform the in-chip overlay measurement between the mask 18_3 of FIG. 5C and the mask 18_4 of FIG. 5D. For example, in the stitching metrology zone 310d, the alignment marks 313 are formed through the mask 18_3 of FIG. 5C, and the alignment marks 314 are formed through the mask 18_4 of FIG. 5D. Therefore, the distances along the X direction and the distances along the Y direction between the alignment marks 313 and 314 are obtained in the in-chip overlay measurement, so as to determine whether the overlay-shift is present between the third lithographic exposure process corresponding to the mask 18_3 and the fourth lithographic exposure process corresponding to the mask 18_4.

In the alignment region 220A, the alignment marks of the overlap metrology zones 360, 370, 380 and 390 are used to perform overlay-shift measurement that measures overlay-shift between different layers of each of the product regions 210A_1 through 210A_4 in the semiconductor structure 200A. For example, the alignment marks of the overlap metrology zone 360 are arranged between the stitching metrology zones 310a and 310b, and are used to perform the layer-to-layer overlay measurement between the masks of the different layers in the product region 210A_1.

In some embodiments, the alignment marks of the overlap metrology zones 360, 370, 380 and 390 are used to further perform critical dimension (CD) measurement that may measure CDs of the features of each of the product regions 210A_1 through 210A_4 in the semiconductor structure 200A. For example, the alignment marks of the overlap metrology zone 360 are used to perform the CD measurement of features corresponding to the mask 18_1 of FIG. 5A.

In some embodiments, each feature within the alignment region 220A is obtained by the corresponding mask that overlaps the alignment region 220A. In other words, the alignment region 220A is exposed in the first through fourth lithographic exposure process. Furthermore, each feature of the alignment region 220A is exposed through the corresponding mask in a single exposure process. For example, each alignment mark 311 is formed by performing the first lithographic exposure process with the mask 18_1 of FIG. 5A.

FIG. 7 shows a plan view of a semiconductor structure 200B, in accordance with some embodiments of the disclosure. The semiconductor structure 200B is a die (e.g., the die 110 of FIG. 2) of a semiconductor wafer (e.g., the semiconductor wafer 100 of FIG. 2), and active and/or passive devices formed within the die, and insulating and conductive layers formed over the semiconductor substrate (e.g., the semiconductor substrate 22 of FIG. 1).

The semiconductor structure 200B includes nine product regions 210B_1 through 210B_9 and four alignment regions 220B_1 through 220B_4. The product regions 210B_1 through 210B_9 are arranged in rows Row1 through Row3 and columns Co11 through Co13 of an array. For example, the product regions 210B_1 through 210B_3 are arranged in the first row Row1 of the array, and the product regions 210B_1, 210B_4 and 210B_7 are arranged in the first column Co11 of the array.

For the semiconductor structure 200B of FIG. 7, the side length along the X direction is W2, and the side length along the Y direction is H2. In some embodiments, the side length along the Y direction (e.g., height or length) is less than the side length along the X direction (e.g., width), i.e., H2<W2. In some embodiments, the longest side of the semiconductor structure 200B (e.g., the side length along the X direction) is greater than the longest side of a given exposed area in a mask. For example, the area of a typical mask is 33 mm×26 mm, and the longest side of the semiconductor structure 200B (e.g., the side length along the X direction) is greater than 33 millimeters. Therefore, the semiconductor structure 200B cannot be formed by using a single mask. In other words, the area of the semiconductor structure 200B is greater than that of a single mask, and the semiconductor structure 200B is formed by stitching multiple masks together. Furthermore, the side length of each of the product regions 210B_1 through 210B_9 along the X direction is about one-third of W2 (e.g., W2/3), and the side length of each of the product regions 210B_1 through 210B_9 along the Y direction is about one-third of H2 (e.g., H2/3).

Each of the product regions 210B_1 through 210B_9 may include a plurality of semiconductor devices, such as transistors, resistors, inductors, capacitors, and so on. Furthermore, each of the product regions 210B_1 through 210B_9 is formed by using respective mask in the corresponding lithography process. Furthermore, the circuit features within each product region (e.g., the circuit features 230_1 through 230_4 of FIG. 3), and the circuit features across two adjacent product regions (e.g., the circuit features 232, 234, 336 and 238 of FIG. 3) are omitted.

As described above, each of the alignment regions 220B_1 through 220B_4 is disposed between four of the product regions of a group. For example, the alignment region 220B_1 is disposed between the product regions 210B_1, 210B_2, 210B_4 and 210B_5 of a group, and the alignment region 220B_2 is disposed between the product regions 210B_2, 210B_3, 210B_5 and 210B_6 of a group. Furthermore, the alignment marks of the alignment regions 220B_1 through 220B_4 are formed by using the masks corresponding to the four adjacent product regions in various lithography processes. For example, the alignment marks of the alignment region 220B_1 are formed by using the masks corresponding to the product regions 210B_1, 210B_2, 210B_4 and 210B_5 of a group, and the alignment marks of the alignment region 220B_2 are formed by using the masks corresponding to the product regions 210B_2, 210B_3, 210B_5 and 210B_6 of a group. Furthermore, the alignment marks of the alignment region 220B_3 are formed by using the masks corresponding to the product regions 210B_4, 210B_5, 210B_7 and 210B_8 of a group, and the alignment marks of the alignment region 220B_4 are formed by using the masks corresponding to the product regions 210B_5, 210B_6, 210B_8 and 210B_9 of a group.

The alignment regions 220B_1 through 220B_4 may have any shape. In FIG. 7, the alignment regions 220B_1 through 220B_4 have a square shape with the same size. In some embodiments, the alignment regions 220B_1 through 220B_4 have a rectangular shape. In some embodiments, the alignment regions 220B_1 through 220B_4 have the same shape. In some embodiments, the alignment regions 220B_1 through 220B_4 have the different shapes.

In the semiconductor structure 200B, the number of rows and columns in the array formed by the product regions 210B_1 through 210B_9 is 3, and the number of the alignment regions is equal to $(3-1)^2$, i.e., the four alignment regions 220B_1 through 220B_4.

In some embodiments, the product regions 210B_1 through 210B_9 of semiconductor structure 200B are disposed in rows and columns of a first array, and the alignment regions 220B_1 through 220B_4 of semiconductor structure 200B are disposed in rows and columns of a second array. In some embodiments, the number of the rows and the number of the columns are the same in the first array. In some embodiments, the number of the rows and the number of the columns are different in the first array. Furthermore, the number of the alignment regions in each row of the second array is equal to the number of the columns of the first array minus one, and the number of the alignment regions in each column of the second array is equal to the number of the rows of the first array minus one. For example, the number of the columns of the first array in FIG. 7 is 3, and the number of the alignment regions in each row of the second array is obtained by subtracting one from three, i.e., 3−1=2. Furthermore, the first and second arrays have the same center point in the semiconductor structure 200B, e.g., the center point of the product region 210B_5.

Various lithographic exposure processes are performed on the photoresist of the semiconductor structure 200B by a lithography system 10 of FIG. 1 with multiple masks. In FIG. 7, the product regions 210B_1, 210B_3, 210B_7 and 210B_9 are located in the four corners of the semiconductor structure 200B. For example, the product region 210B_1 is located in the upper left corner of the semiconductor structure 200B, and a mask having the region distribution similar to the mask 18_1 of FIG. 5A is used to expose the photoresist of the product region 210B_1 and the alignment region 220B_1. The product region 210B_3 is located in the upper right corner of the semiconductor structure 200B, and a mask having the region distribution similar to the mask 18_2 of FIG. 5B is used to expose the photoresist of the product region 210B_3 and the alignment region 220B_2. The product region 210B_7 is located in the lower left corner of the semiconductor structure 200B, and a mask having the region distribution similar to the mask 18_3 of FIG. 5C is used to expose the photoresist of the product region 210B_7 and the alignment region 220B_3. The product region 210B_9 is located in the lower right corner of the semiconductor structure 200B, and a mask having the region distribution similar to the mask 18_4 of FIG. 5D is used to expose the photoresist of the product region 210B_9 and the alignment region 220B_4. As described above, the product regions 210B_1, 210B_3, 210B_7 and 210B_9 have the similar shape and the similar size area.

In FIG. 7, the product region 210B_5 is located at the center of the semiconductor structure 200B, and the four alignment regions 220B_1 through 220B_4 are located at the four corners of the product region 210B_5. Furthermore, the product regions 210B_2, 210B_4, 210B_6 and 210B_8 are located at the edges of the semiconductor structure 200B. For example, the product region 210B_4 is located at the left edge of the semiconductor structure 200B and between the product regions 210B_1 and 210B_7, and the product region 210B_8 is located at the lower edge of the semiconductor structure 200B and between the product regions 210B_7 and 210B_9. Moreover, the product region 210B_6 is located at the right edge of the semiconductor structure 200B and between the product regions 210B_3 and 210B_9, and the product region 210B_2 is located at the upper edge of the semiconductor structure 200B and between the product regions 210B_1 and 210B_2. The masks of the product regions 210B_2, 210B_4, 210B_5, 210B_6 and 210B_8 will be described below.

In some embodiments, the shape and the size area of the product region 210B_5 is different from that of the other product regions in the semiconductor structure 200B. In some embodiments, the product regions 210B_2, 210B_4, 210B_6 and 210B_8 have the similar shape and the similar size area.

Figure 8A:
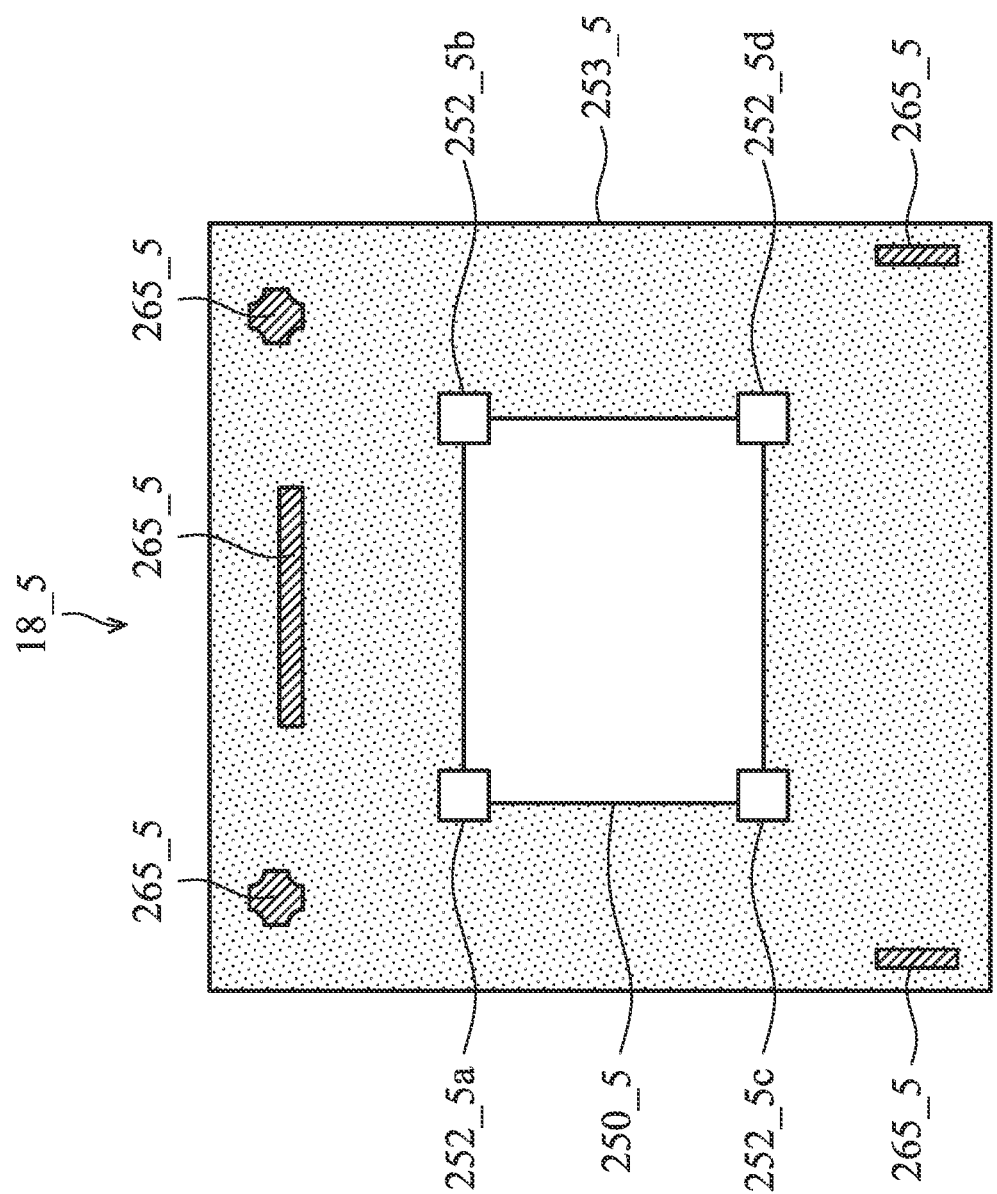
FIGS. 8A-8E show the masks corresponding to the product regions of FIG. 7, in accordance with some embodiments of the disclosure.

Referring to FIG. 8A, FIG. 8A shows a mask 18_5 corresponding to the product region 210B_5 of FIG. 7, in accordance with some embodiments of the disclosure. In a lithographic exposure process, the mask 18_5 is used to expose the photoresist of the product region 210B_5 and the alignment regions 220B_1 through 220B_4 according to the features present in the mask 18_5.

In FIG. 8A, the mask 18_5 includes a main field 250_5 and four stitching regions 252_5a through 252_5d. The stitching regions 252_5a, 252_5b, 252_5c and 252_5d are respectively arranged in the upper left corner, the upper right corner, the lower left corner and the lower right corner of the main field 250_5, and contact the main field 250_5. As described above, the main field 250_5 includes multiple mask features (not shown), and the mask features correspond to circuit features to be formed in the semiconductor structure 200B. When forming the circuit features, the area exposed by the main field 250_5 does not overlap with the exposed area of other mask in exposure process.

In the mask 18_5, the stitching regions 252_5a through 252_5d include multiple alignment marks (not shown). The alignment marks correspond to alignment features to be formed for verifying the stitching result of multiple masks. For example, the alignment marks of the stitching region 252_5b are used to verify the stitching result of the masks corresponding to the product regions 210B_2, 210B_3, 210B_5 and 210B_6. When forming the alignment marks of each of the stitching regions 252_5a through 252_5d, the area exposed by the corresponding stitching region in one lithographic exposure process overlaps with the area exposed by the stitching region of other mask in other lithographic exposure process.

In FIG. 8A, the mask 18_5 further includes a periphery field 253_5. In some embodiments, the main field 250_5 and the stitching regions 252_5a through 252_5d are surrounded by the periphery field 253_5.

In FIG. 8A, the mask 18_5 further includes the mark regions 265_5 within the periphery field 253_5. Each mark region 265_5 includes multiple alignment marks (not shown), and the mark regions 265_5 are arranged away from the main field 250_5. As described above, the mark regions 265_5 may include inter-level alignment marks, and/or other fiducial features.

Figure 8B:
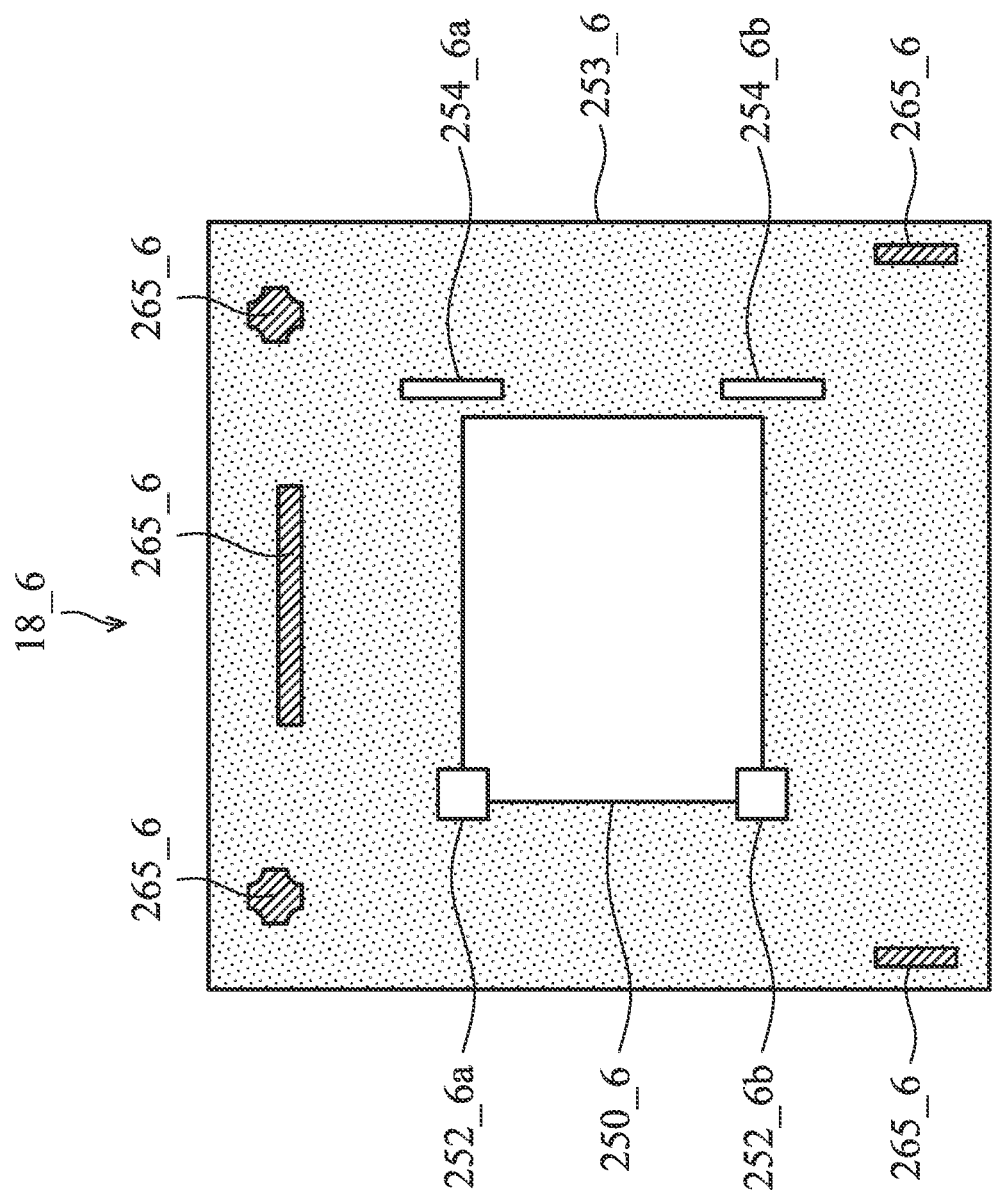

FIG. 8B shows a mask 18_6 corresponding to the product region 210B_6 of FIG. 7, in accordance with some embodiments of the disclosure. In a lithographic exposure process, the mask 18_6 is used to expose the photoresist of the product region 210A_6 and the alignment regions 220B_2 and 220B_4 according to the features present in the mask 18_6.

In FIG. 8B, the mask 18_6 includes a main field 250_6 and the stitching regions 252_6a and 252_6b. The stitching regions 252_6a and 252_6b are arranged in the upper left corner and the lower left corner of the main field 250_6, and contact the main field 250_6. The main field 250_6 includes multiple mask features (not shown). The mask features correspond to circuit features to be formed in the semiconductor structure 200B, and when forming the circuit features, the area exposed by the main field 250_6 does not overlap with the exposed area of other mask in exposure process.

In the mask 18_6, the stitching regions 252_6a and 252_6b includes multiple alignment marks (not shown). The alignment marks correspond to alignment features to be formed for verifying the stitching result of multiple masks. For example, the alignment marks of the stitching region 252_6a are used to verify the stitching result of the masks corresponding to the product regions 210B_2, 210B_3, 210B_5 and 210B_6. Furthermore, when forming the alignment marks, the area exposed by the stitching region 252_6a of the mask 18_6 in FIG. 8B overlaps with the area exposed by the stitching region 252_5b of the mask 18_5 in FIG. 8A, and the area exposed by the stitching region 252_6b of the mask 18_6 in FIG. 8B overlaps with the area exposed by the stitching region 252_5d of the mask 18_5 in FIG. 8A.

In FIG. 8B, the mask 18_6 further includes a periphery field 253_6. Furthermore, the mask 18_6 further includes the mark regions 254_6a and 254_6b within the periphery field 253_6. The mark regions 254_6a and 254_6b are close to the main field 250_6 and separated from the main field 250_6 by the periphery field 253_6. Each of the mark regions 254_6a and 254_6b includes multiple alignment marks (not shown). The alignment marks correspond to alignment features to be formed in the scribe lines (e.g., the scribe line 120 of FIG. 2). Furthermore, the mark regions 254_6a and 254_6b are arranged close to the upper right corner and the lower right corner of the main field 250_6, respectively. As described above, when forming the alignment marks, the areas exposed by the mark regions 254_6a and 254_6b overlap with the exposed area of other mask corresponding to adjacent product regions in exposure process.

In FIG. 8B, the mask 18_6 further includes the mark regions 265_6 within the periphery field 253_6. Each of the mark regions 265_6 includes multiple alignment marks (not shown), and the mark regions 265_6 are arranged away from the main field 250_6. In some embodiments, the mark regions 265_6 may include inter-level alignment marks, and/or other fiducial features.

Figure 8C:
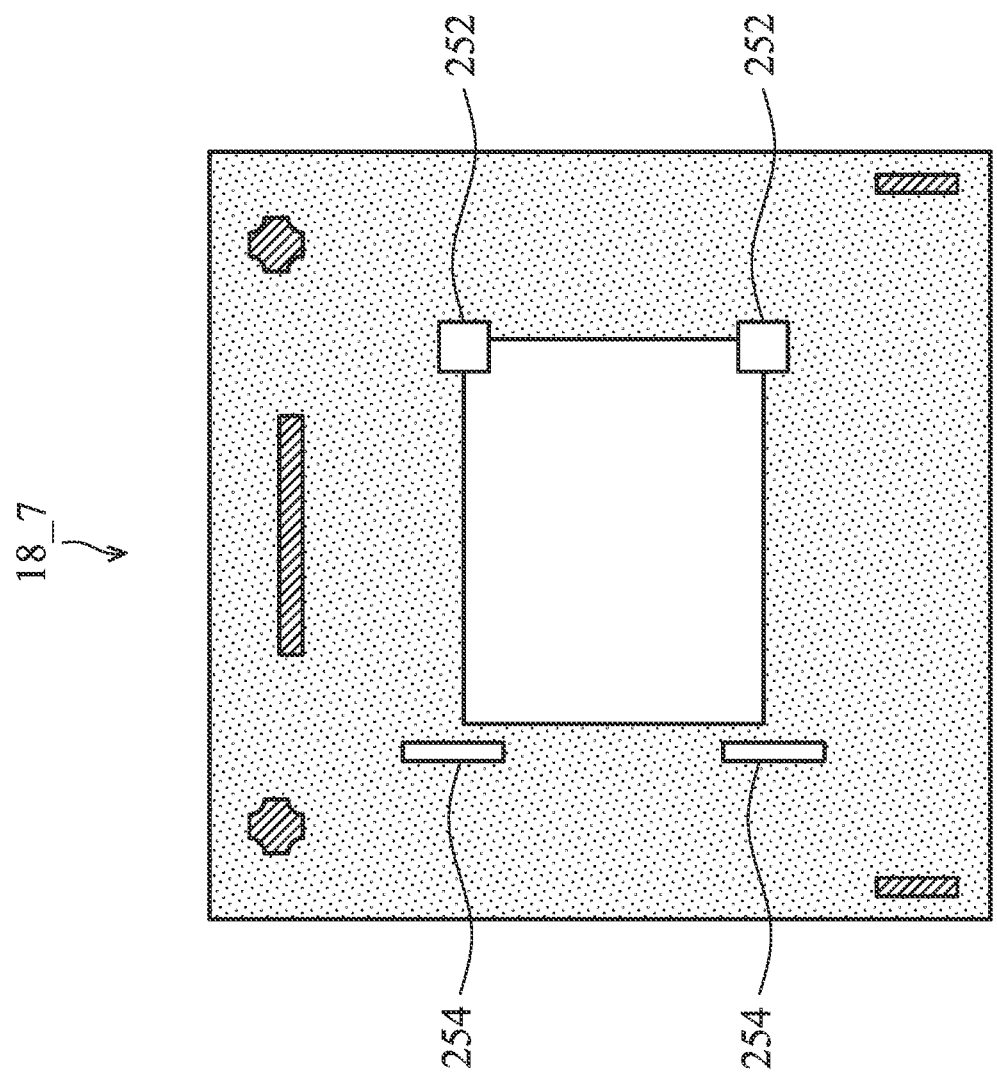
Figure 8D:
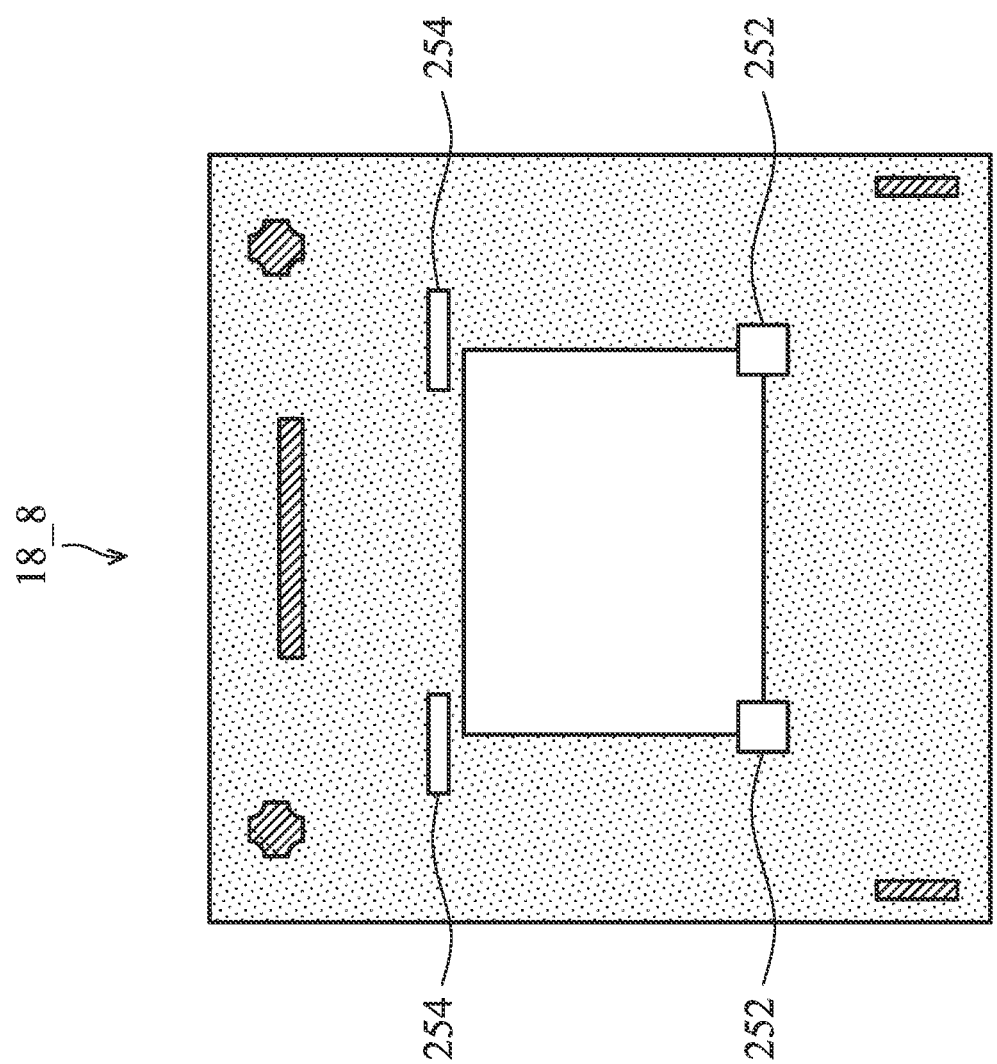
Figure 8E:
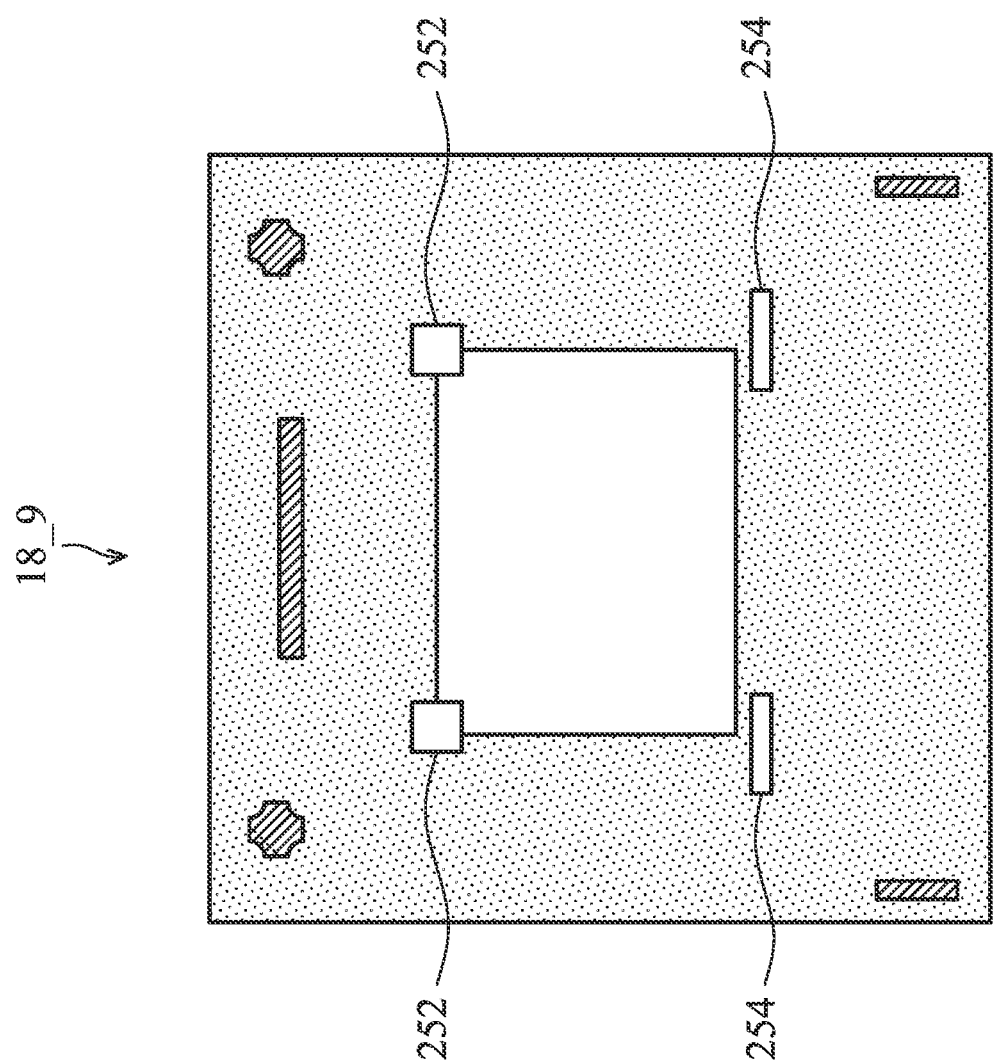

FIGS. 8C, 8D and 8E show the masks 18_7, 18_8 and 18_9 corresponding to the product regions 210B_4, 210B_2 and 210B_8 of FIG. 7, respectively, in accordance with some embodiments of the disclosure. Similar to the mask 18_6 of FIG. 8B, each of the masks 18_7, 18_8 and 18_9 include two stitching regions 252 and two mark regions 254. As described above, the region locations of the stitching regions 252 and the mark regions 254 of the masks 18_7, 18_8 and 18_9 are determined according to the locations of the product regions 210B_4, 210B_2 and 210B_8 of FIG. 7, and will be omitted here.

In the packaging of integrated circuits, multiple dies are bonded on an interposer. When the number or size of the dies increases, the size of the interposer also increases. After bonding the dies, an underfill is dispensed into the gaps between the dies and the interposer. A curing process may then be performed to cure the underfill. A molding compound can be applied to encapsulate the dies therein. In some embodiments, the interposer and the dies thereon are then sawed apart into multiple packages, with the packages including exposed electrical connectors such as solder balls. The package is then bonded to a package substrate or a printed circuit board (PCB).

Figure 9:
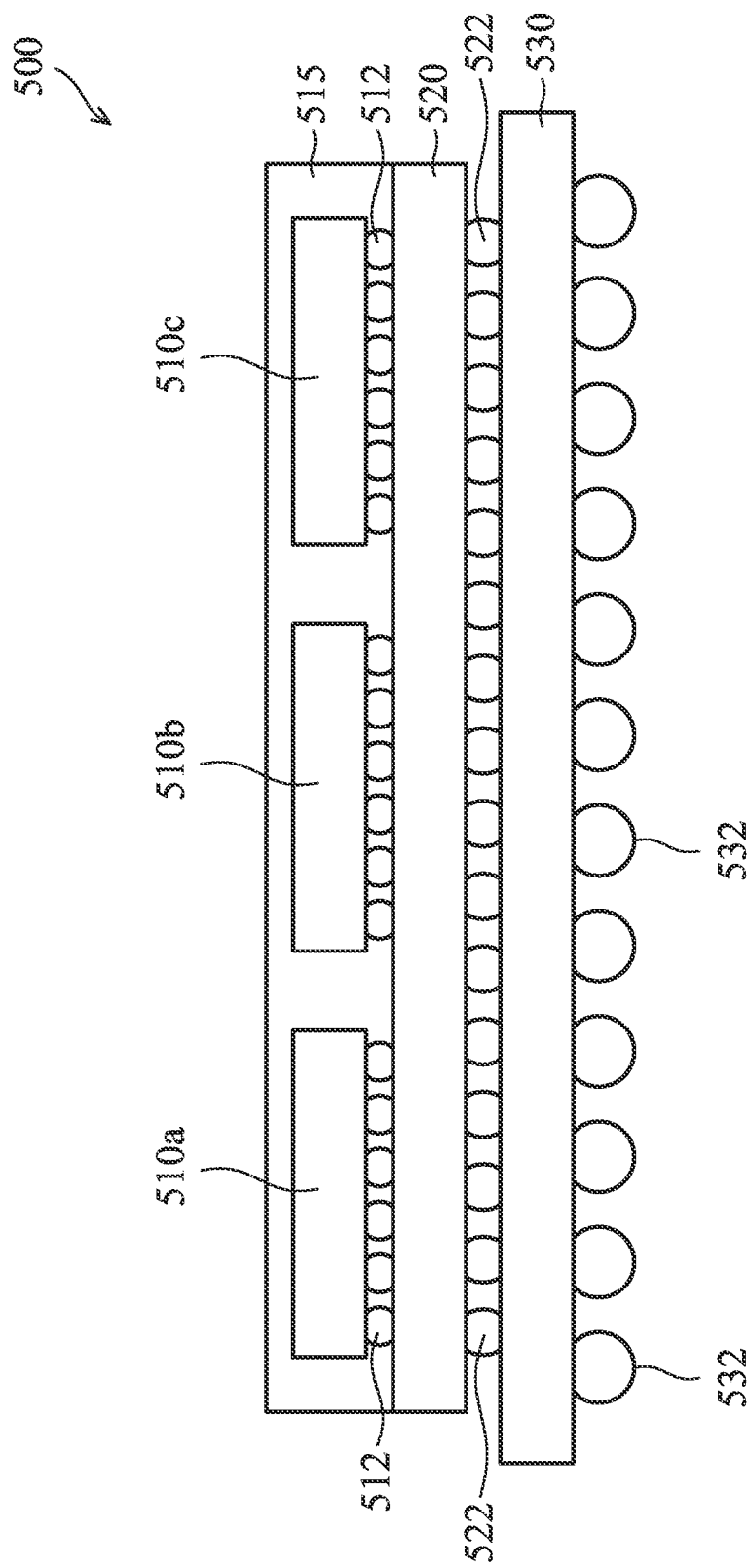
FIG. 9 shows a cross sectional view of a Chip-on-Wafer-on-Substrate (CoWoS) structure, in accordance with some embodiments of the disclosure

FIG. 9 shows a cross sectional view of a Chip-on-Wafer-on-Substrate (CoWoS) structure 500, in accordance with some embodiments of the disclosure. The CoWoS structure 500 includes multiple dies 510a through 510c bonded on the interposer 520 through flip-chip bonding. The dies 510a through 510c may be ICs including active devices and/or passive devices. The interposer 520 is a semiconductor structure including active and/or passive devices. In some embodiments, no active device is present in the interposer 520. Furthermore, the interposer 520 is formed by using the method of FIG. 4, and includes one or more alignment regions (e.g., 220A of FIG. 3 or 220B_1 through 220B_2 of FIG. 7). As described above, each alignment region is formed through multiple lithographic exposure processes with the stitching regions of multiple masks. In some embodiments, the dies 510a through 510c may be encapsulated in encapsulating material 515, which may be a molding compound or a molding underfill. Furthermore, the interposer 520 is further formed on a package substrate 530, which may be a laminate substrate or a built-up substrate. In the CoWoS structure 500, the solder balls 512, 522, and 532 are used for bonding.

Embodiments for semiconductor structures and methods for fabricating the semiconductor structures are provided. By stitching multiple masks together, a semiconductor structure that is greater than the maximum size defined by a single mask can be formed. The semiconductor structure includes multiple product regions, and the circuit features to be formed in each product region is formed through the corresponding mask. In other words, when forming the circuit features of the product region, the area exposed by the corresponding mask does not overlap with the exposed area of other mask in exposure process. Furthermore, an alignment region is a stitching region including multiples alignment marks, and the alignment marks correspond to alignment features to be formed for verifying the stitching result of multiple masks. Each stitching region is shared by the four adjacent product regions. Therefore, the alignment marks of the alignment region in the same layer formed by the two corresponding masks are compared to perform in-chip overlay measurement for process-control-monitor (PCM), thereby increasing accurate overlay measurement.

In some embodiments, a method for fabricating a semiconductor structure is provided. A semiconductor substrate is formed. A plurality of die areas are formed on the semiconductor substrate. The die areas are separated from each other by a plurality of scribe lines. A plurality of first features are formed in a first product region of each of the die areas and in a material layer through a first mask. A plurality of second features are formed in a second product region of each of the die areas and in the material layer through a second mask. A plurality of third features are formed in a third product region of each of the die areas and in the material layer through a third mask. A plurality of fourth features are formed in a fourth product region of each of the die areas and in the material layer through a fourth mask. A plurality of fifth features are formed in an alignment region between the first, second, third and fourth product regions of each of the die areas and in the material layer through the first, second, third and fourth masks. The first product region is adjacent to and in physical contact with the second and third product regions, and the first product region is free of the second, third, and fourth features.

In some embodiments, a method for fabricating a semiconductor structure is provided. A semiconductor substrate is formed. A plurality of product regions are formed in a die area over the semiconductor substrate. A plurality of alignment regions are formed in the die area over the semiconductor substrate. A plurality of first features are formed within the product regions and in a material layer over the semiconductor substrate through a plurality of masks. The first features within each of the product regions is formed through one of the masks. A plurality of second features are formed between the product regions and in the material layer through the masks. Each of the alignment regions is disposed between four of the product regions of a group, and each of the product regions in the group is adjacent to and in physical contact with two other product regions. Each of the second features extends across two adjacent product regions in the group and is formed through two of the masks corresponding to the two adjacent product regions.

In some embodiments, a method for fabricating a semiconductor structure is provided. A semiconductor substrate is formed. A plurality of product regions are formed in rows and columns of a first array within a die area over the semiconductor substrate. A plurality of alignment regions are formed in rows and columns of a second array within the die area over the semiconductor substrate. A plurality of circuit features are formed in a material layer over the semiconductor substrate and within the product regions. A plurality of alignment features are formed in the material layer over the semiconductor substrate and within the alignment regions. The circuit features within the same product region are formed with the same mask, and the alignment features within the same alignment region are formed with different masks. Each of the alignment regions is disposed between four of the product regions of a group, and each of the product regions in the group is adjacent to and in physical contact with two other product regions. The first and second arrays have a same center point.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor structure, comprising:
   forming a semiconductor substrate;
   forming a plurality of die areas on the semiconductor substrate, wherein the die areas are separated from each other by a plurality of scribe lines;
   forming a plurality of first features in a first product region of each of the die areas and in a material layer through a first mask;
   forming a plurality of second features in a second product region of each of the die areas and in the material layer through a second mask;
   forming a plurality of third features in a third product region of each of the die areas and in the material layer through a third mask;
   forming a plurality of fourth features in a fourth product region of each of the die areas and in the material layer through a fourth mask; and
   forming a plurality of fifth features in an alignment region between the first, second, third and fourth product regions of each of the die areas and in the material layer through the first, second, third and fourth masks,
   wherein the first product region is adjacent to and in physical contact with the second and third product regions, and the first product region is free of the second, third, and fourth features.

2. The method as claimed in claim 1, wherein the first, second, third and fourth product regions are free of the fifth features.

3. The method as claimed in claim 1, wherein the fifth features in the alignment region of each of the die areas form an in-die alignment pattern.

4. The method as claimed in claim 1, wherein the first, second, third and fourth product regions have a similar shape and a similar size area, and a longest side of the die area is greater than a longest side of the first mask.

5. The method as claimed in claim 1, wherein the material layer comprises dielectric material.

6. The method as claimed in claim 1, wherein the first, second, third, fourth and fifth features comprise conductive material.

7. A method for fabricating a semiconductor structure, comprising:
   forming a semiconductor substrate;
   forming a plurality of product regions in a die area over the semiconductor substrate;
   forming a plurality of alignment regions in the die area over the semiconductor substrate;
   forming a plurality of first features within the product regions and in a material layer over the semiconductor substrate through a plurality of masks, wherein the first features within each of the product regions is formed through one of the masks;
   forming a plurality of second features between the product regions and in the material layer through the masks,
   wherein each of the alignment regions is disposed between four of the product regions of a group, and each of the product regions in the group is adjacent to and in physical contact with two other product regions,
   wherein each of the second features extends across two adjacent product regions in the group and is formed through two of the masks corresponding to the two adjacent product regions.

8. The method as claimed in claim 7, wherein the material layer comprises dielectric material, and the first and second features comprise conductive material.

9. The method as claimed in claim 7, wherein a width of the first features is equal to a width of the second features.

10. The method as claimed in claim 7, wherein each of the alignment regions is free of the first and second features.

11. The method as claimed in claim 7, further comprising:
    forming a plurality of third features in the material layer and in each of the alignment regions between the four of the product regions of the group through four of the masks corresponding to the four of the product regions of the group,
    wherein each of the product regions is free of the third features.

12. The method as claimed in claim 7, wherein longest sides of the product regions are the same, and portions of the product regions have a similar shape and a similar size area, wherein a longest side of the semiconductor structure is greater than a longest side of the masks.

13. The method as claimed in claim 7, wherein forming the product regions in the die area over the semiconductor substrate further comprises:
    arranging the product regions in rows and columns of a first array in the die area,
    wherein forming the alignment regions in the die area over the semiconductor substrate further comprises:
    arranging the alignment regions in rows and columns of a second array in the die area,
    wherein the first and second arrays have a same center point.

14. The method as claimed in claim 13, wherein a number of the alignment regions in each row of the second array is equal to a number of the columns of the first array minus one, and the number of the alignment regions in each column of the second array is equal to a number of the rows of the first array minus one, wherein the number of the columns of the first array is different from the number of the rows of the first array.

15. A method for fabricating a semiconductor structure, comprising:
    forming a semiconductor substrate;
    forming a plurality of product regions in rows and columns of a first array within a die area over the semiconductor substrate;
    forming a plurality of alignment regions in rows and columns of a second array within the die area over the semiconductor substrate;
    forming a plurality of circuit features in a material layer over the semiconductor substrate and within the product regions; and
    forming a plurality of alignment features in the material layer over the semiconductor substrate and within the alignment regions,
    wherein the circuit features within a same product region are formed with a same mask, and the alignment features within a same alignment region are formed with different masks, wherein each of the alignment regions is disposed between four of the product regions of a group, and each of the product regions in the group is adjacent to and in physical contact with two other product regions, wherein the first and second arrays have a same center point.

16. The method as claimed in claim 15, wherein a number of rows and columns in the first array is N, and a number of the alignment regions is equal to $(N-1)^2$.

17. The method as claimed in claim 15, wherein longest sides of the product regions are the same and portions of the product regions have a similar shape and a similar size area, wherein a longest side of the semiconductor structure is greater than 33 millimeters.

18. The method as claimed in claim 15, wherein the second features in each of the alignment regions form an in-die alignment pattern.

19. The method as claimed in claim 15, wherein the material layer comprises dielectric material, and the circuit features and the alignment features comprise conductive material.

20. The method as claimed in claim 15, wherein each of the product regions is free of the alignment features, and each of the alignment regions is free of the circuit features.

* * * * *